United States Patent
Elfadel et al.

(10) Patent No.: US 8,331,168 B2
(45) Date of Patent: Dec. 11, 2012

(54) INCREASED CAPACITY HETEROGENEOUS STORAGE ELEMENTS

(75) Inventors: Ibrahim M. Elfadel, Yorktown Heights, NY (US); Michele Franceschini, Yorktown Heights, NY (US); Ashish Jagmohan, Yorktown Heights, NY (US); Luis A. Lastras-Montano, Yorktown Heights, NY (US); Mayank Sharma, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 689 days.

(21) Appl. No.: 12/433,157

(22) Filed: Apr. 30, 2009

(65) Prior Publication Data
US 2010/0277989 A1 Nov. 4, 2010

(51) Int. Cl.
*G11C 7/00* (2006.01)
(52) U.S. Cl. ......... 365/189.14; 365/189.15; 365/189.16; 365/163
(58) Field of Classification Search ............. 365/189.14, 365/189.15, 189.16, 163
See application file for complete search history.

(56) References Cited

U.S. PATENT DOCUMENTS

| | | | |
|---|---|---|---|
| 5,278,793 A | 1/1994 | Yeh | |
| 5,572,470 A | 11/1996 | McClure et al. | |
| 5,596,522 A | 1/1997 | Ovshinsky et al. | |
| 5,933,852 A | 8/1999 | Jeddeloh | |
| 6,473,332 B1 | 10/2002 | Ignatiev et al. | |
| 6,639,858 B2 | 10/2003 | Kinoshita et al. | |
| 7,433,246 B2 * | 10/2008 | Lee | 365/189.14 |
| 2004/0114429 A1 | 6/2004 | Ehiro et al. | |
| 2004/0130938 A1 | 7/2004 | Hamaguchi | |
| 2005/0157567 A1 | 7/2005 | Gilton | |
| 2008/0151612 A1 | 6/2008 | Pellizzer et al. | |
| 2008/0298126 A1 | 12/2008 | Ohta et al. | |
| 2009/0010051 A1 | 1/2009 | Parkinson | |
| 2009/0016099 A1 | 1/2009 | Jeong et al. | |
| 2011/0007565 A1 * | 1/2011 | Hazama | 365/185.03 |
| 2012/0079177 A1 * | 3/2012 | Brewer et al. | 711/103 |
| 2012/0092932 A1 * | 4/2012 | Sarin et al. | 365/185.19 |

OTHER PUBLICATIONS

Bedeschi et al.; A Bipolar-Selected Phase Change Memory Featuring Multi-Level Cell Storage Solid-State Circuits, IEEE Journal of; vol. 44, Issue 1, Jan. 2009 pp. 217-227.
Rajendran et al."On the dynamic resistance and reliability of phase change memory" VLSI Technology, 2008 Symposium on; Jun. 17-19, 2008 pp. 96-97.
Zhu et al., "Finite-geometry low-density parity-check codes for channels with stuck-at defects," in Canadian Workshop on Information Theory, 2005. pp. 4.
Heegard, "Partitioned linear block codes for computer memory with 'stuck-at' defects," IEEE Transactions on Information Theory 29, No. 6 (1983): 831-842.
Borden et al., "On coding for'stuck-at'defects (Corresp.)," IEEE Transactions on Information Theory 33, No. 5 (1987): 729-735.

(Continued)

*Primary Examiner* — Vu Le
*Assistant Examiner* — Han Yang
(74) *Attorney, Agent, or Firm* — Cantor Colburn LLP; Brian Verminski

(57) ABSTRACT

Providing increased capacity in heterogeneous storage elements including a method for storing data including a write process writing to a memory and a read process reading from the memory. Physical characteristics of memory cells in the memory support different sets of data levels. The write process takes into account the different sets of data levels when writing to the memory. The read process first obtains data in the memory and subsequently determines how to interpret the data.

15 Claims, 26 Drawing Sheets

OTHER PUBLICATIONS

Krishnamoorthy et al., "Error Control to Increase the Yield of Semiconductor RAM's," in Information Theory Workshop at Cornell, The 1989 IEEE/CAM, 1989, p. 1.

Fridrich et al. "Steganography via codes for memory with defective cells," in 43rd Conference on Coding, Communication, and Control, 2005. p. 17.

Zamir et al., "Nested linear/lattice codes for structured multiterminal binning," IEEE Transactions on Information Theory 48, No. 6 (2002): 1250-1276.

Heegard et al. "On the capacity of computer memory with defects," IEEE transactions on Information theory 29, No. 5 (1983): 731-739.

* cited by examiner

INCREASED CAPACITY HETEROGENEOUS STORAGE ELEMENTS

BACKGROUND

This invention relates generally to computer memory, and more specifically to increasing the storage capacity of heterogeneous storage elements.

The term "heterogeneous storage elements" refers to individual memory elements having different physical characteristics, which affect the type and amount of information that the element can store. Thus, each element can store a different type and amount of information depending on its particular physical characteristics. An example of a memory system having heterogeneous storage elements is a phase change memory (PCM) system, where the range of resistance values that can be set is different for different PCM cells. In a PCM each cell supports a different range of resistance levels, which affects both the level range (amount of data) and the absolute level values (type of data) that the cell can support. The heterogeneity of the elements may, in general, cause errors in storing information into the memory and retrieving information from the memory. Specifically, while writing data into the memory, the writer may end up trying to store information in a cell, which the cell cannot support.

One approach to reducing errors in a heterogeneous storage element environment is to find a range of physical characteristics common to all memory elements and then to store information so that it can be retrieved within this common range of physical characteristics. As an example, in a PCM memory cell, a range of resistance values may exist which can be set across all PCM memory elements. Then, only this common range of resistance values is used to store information. Another approach is to treat non-writable cell values as errors and using an error correction code (ECC) to correct the data. A shortcoming to both of these approaches is that they may lead to a loss in storage capacity.

Another approach to reducing errors in a heterogeneous storage element environment is to assume that memory blocks or individual memory elements are either defective or non-defective, and then seeking to circumvent defective blocks or elements during data reading and/or writing. A drawback to these approaches is that they assume that blocks or individual elements can be in one of only two states and thus they are not designed for heterogeneity in general.

SUMMARY

An exemplary embodiment is a method for storing data including a write process writing to a memory and a read process reading from the memory. Physical characteristics of memory cells in the memory support different sets of data levels. The write process takes into account the different sets of data levels when writing to the memory. The read process first obtains data in the memory and subsequently determines how to interpret the data.

Another embodiment is a method for reading from memory. The method includes receiving a read word from a block of memory cells, where physical characteristics of the memory cells support different sets of data levels. The read word is separated into two or more virtual read vectors. For each of the virtual read vectors, the codebook that was utilized to generate the virtual read vector is identified and a partial read data vector is generated. The generating includes multiplying the virtual read vector by a matrix that represents the codebook. The partial read data vectors are combined into a read message and the read message is output.

An additional exemplary embodiment is a memory system including a memory, a tester and an encoder. The memory includes a block of memory cells where physical characteristics of the memory cells support different set of data levels. The tester determines physical characteristics of the memory cells. The encoder is connected to the memory and the tester, and employs at least one codebook. The encoder receives a write message to be written to the block of memory cells and identifies virtual memories associated with the block of memory cells in response to the physical characteristics. For each of the virtual memories, a constraint vector is generated that describes the virtual cells in the virtual memory. The generating of the constraint vector is in response to the physical characteristics of the physical memory cells, to previously generated constraint vectors, and to previously generated virtual write vectors. In addition, a virtual write vector is calculated for each of the virtual memories. The calculating is in response to a codebook, the constraint vector and the write message. The virtual write vectors are combined into a write word and the write word is output to the block of memory cells.

An additional exemplary embodiment is a method for writing to a heterogeneous memory. The method includes receiving a write message and a write address corresponding to a block of memory cells where at least two of the memory cells support different data levels; determining physical characteristics of the memory cells; and identifying virtual memories associated with the block of memory cells in response to the physical characteristics. The following is performed for each of the virtual memories: generating a constraint vector that describes the virtual cells in the virtual memory, the generating responsive to the physical characteristics of the physical memory cells, to previously generated constraint vectors, and to previously generated virtual write vectors; and calculating a virtual write vector in response to the constraint vector and the write data, the calculating including writing the write data, bit by bit, in order, into the virtual memory, skipping locations known to be stuck to a particular value as indicated by the constraint vector. The virtual write vectors are combined into a write word and the write word is output to the block of memory cells.

A further exemplary embodiment is a method for reading from a heterogeneous memory. The method includes receiving a read word from a block of memory cells where at least two of the memory cells support different data levels; determining physical characteristics of the memory cells; identifying virtual memories associated with the block of memory cells in response to the physical characteristics; and separating the read word into a plurality of virtual read vectors, the separating responsive to the virtual memories. The following is performed for each of the virtual read vectors: generating a constraint vector that describes the virtual cells in the virtual memory, the generating in response to the physical characteristics of the physical memory cells, to previously generated constraint, and to previously generated partial read vectors; and generating a partial read data vector in response to the constraint vector and the virtual read vector, the generating including reading the virtual read vector, bit by bit, in order, and discarding the bits known to be stuck as indicated by the constraint vector. The partial read data vectors are combined into a read message and the read message is output.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
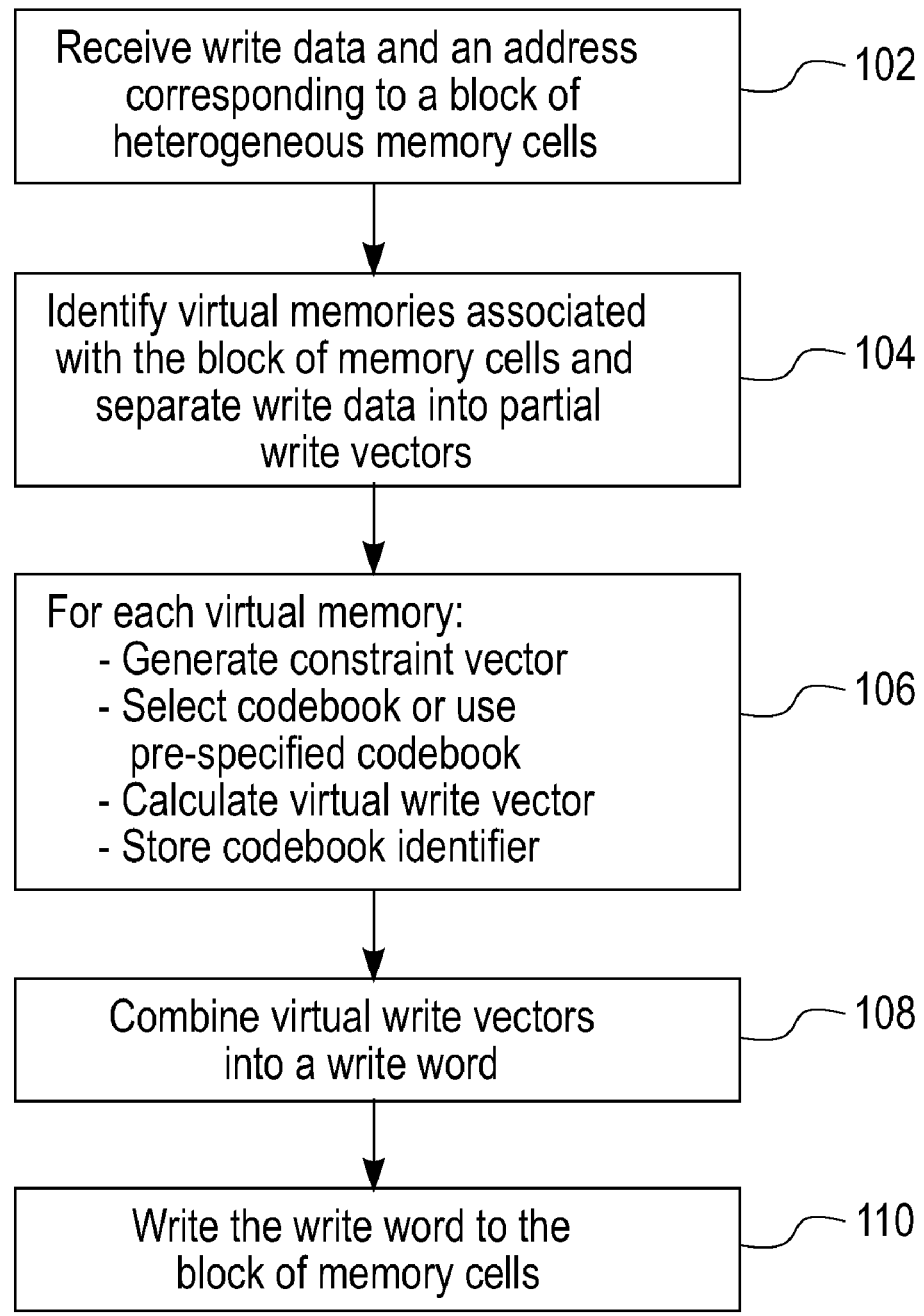
FIG. 1 illustrates a process for writing data that may be implemented by an exemplary embodiment.

An exemplary embodiment of the present invention increases the storage capacity of memory with heterogeneous elements by measuring the relevant physical characteristics of each memory element prior to writing and/or after reading the data, and by exploiting this knowledge using coding techniques. In an exemplary embodiment, the memory is made up of phase change memory (PCM) cells and the write process measures the resistance range of each cell by applying RESET and SET pulses prior to writing. Next, the resistance levels that can be stored on each cell are quantized, the quantization indices are converted to binary, and a set of binary codes are used which can store data on each cell without violating the cell resistance limits. In another exemplary embodiment, the read process additionally measures the physical characteristics of each cell after reading by applying RESET and SET pulses and then re-writes the original data. The measured physical characteristics are utilized by the read process to aid in decoding the data written by the encoder.

An exemplary embodiment includes PCM, and all PCM cells are assumed to have a common maximum (RESET) resistance level and a variable minimum (SET) level. In this embodiment, the write process includes the step of programming each of a block of cells to its SET level using an appropriate programming pulse, and measuring the SET resistance level. Based on this information, an appropriate code is used to transform the data to be written to a set of resistance levels, which are compatible with the cell resistance ranges. In another exemplary embodiment, both the minimum and maximum resistance levels of each PCM cell are variable. The write process includes the step of programming each of a block of cells to its SET and RESET levels, using appropriate programming pulses, and measuring the SET and RESET resistance levels. Based on this information, an appropriate code is used to transform the data to be written to a set of resistance levels, which are compatible with the cell resistance ranges.

In an exemplary embodiment, the transformation steps are performed as follows. The resistance levels are first converted to binary values. Each bitplane is used to store a different data message. For a given bitplane, the binary word to be written into memory is generated by aid of a binary matrix ("H"), shared by the read and write process. Specifically, a binary vector "c" is found such that Hc is equal to the binary message to be stored, and such that c satisfies a set of binary constraints imposed by the memory cell heterogeneity. The binary vector is written into the bitplane. The read process reconstructs the message by computing Hc.

In another exemplary embodiment, the conversion of resistance levels to binary values is achieved such that each cell has a different binarization for a given level. This facilitates equalization of coding rates across bitplanes, thus reducing the number of binary matrices (H) required in the system, which in turn may reduce storage/hardware complexity. In another exemplary embodiment, the conversion of resistance levels to binary values is achieved by a fixed permutation of the binarization of the resistance level represented as an integer. In another exemplary embodiment, the transformation step above is performed by generating the data to be encoded by aid of a non-binary matrix H shared by the read and write process. Specifically, a vector c is found such that Hc is equal to the non-binary message to be stored, and such that c satisfies a set of constraints imposed by the memory homogeneity. The vector c is written into the memory. The read process reconstructs the message by computing Hc.

As used herein, the term "data level" refers to a specific data value that corresponds to (or "is represented by") a pre-specified range of the cell's physical characteristic's value. To support a given data level, it is possible to set the cell's physical characteristic to take on a value within the range corresponding to the data level. In a hypothetical example using PCM, taking the physical characteristic of resistance, a cell resistance of 0-10 Ohms may correspond to data value=1, cell resistance of 10-20 Ohms may correspond to data value=2 and so on. Thus a cell supports data level 1 if its resistance can be made to lie in the 0-10 Ohms range.

FIG. 1 illustrates a process for writing data that may be implemented by an exemplary embodiment. At block 102, write data (also called a write message) and an address corresponding to a block of heterogeneous memory cells are received (e.g., into an encoder). At block 104, the virtual memories associated with the block of memory cells are identified and the write data is separated into multiple partial write data vectors, each of which is associated with one virtual memory. The number of virtual memories depends on physical characteristics of the block of memory cells. For example, a physical characteristic of PCM cells may include a resistance level. If the resistance level could have up to four values, then the number of virtual memories is two (i.e., two raised to the second power is four, so four values can be supported in two bits). Alternatively if the resistance level could have five to eight values, then the number of virtual memories is three (i.e., two raised to the third power is eight, so eight values can be supported in three bits).

At block 106 in FIG. 1, a process is performed for each virtual memory identified in step 104. A constraint vector describing the virtual cells in the virtual memory is generated. Input to generating the constraint vector is the physical characteristics of the memory cells, any previously generated constraint vectors for the block of memory cells (e.g., for other virtual memories) and any previously generated virtual write vectors for the block of memory cells. Thus, the write process is aware of the physical characteristics of the memory cells. Next, a codebook is selected based on contents of the constraint vector and on the number of memory cells in the block of memory cells. In an alternate exemplary embodiment, the codebook is fixed and known a-priori to both read and write processes, in which case the selection step is unnecessary. The codebook can specify both linear and non-linear codes. A virtual write vector for the virtual memory is calculated based on the codebook, the constraint vector and the write data. In case the codebook is not fixed, an identifier associated with the codebook is stored so that it can be utilized when the block of memory cells is read. The code index can be referred to as meta-data. Similarly, the codebook can also be referred to as meta-data. Meta-data can be stored in a variety of locations, including, but not limited to: in a different non-heterogeneous memory or in the heterogeneous memory in a reliable manner, such as in a special pre-tested area of memory, or by using the scheme of only writing to levels supported by all cells. If the codebook is fixed, no meta-data needs to be stored. At block 108, the virtual write vectors are combined into a write word. At block 110, the write word is output to the block of memory cells to be written.

Figure 2:
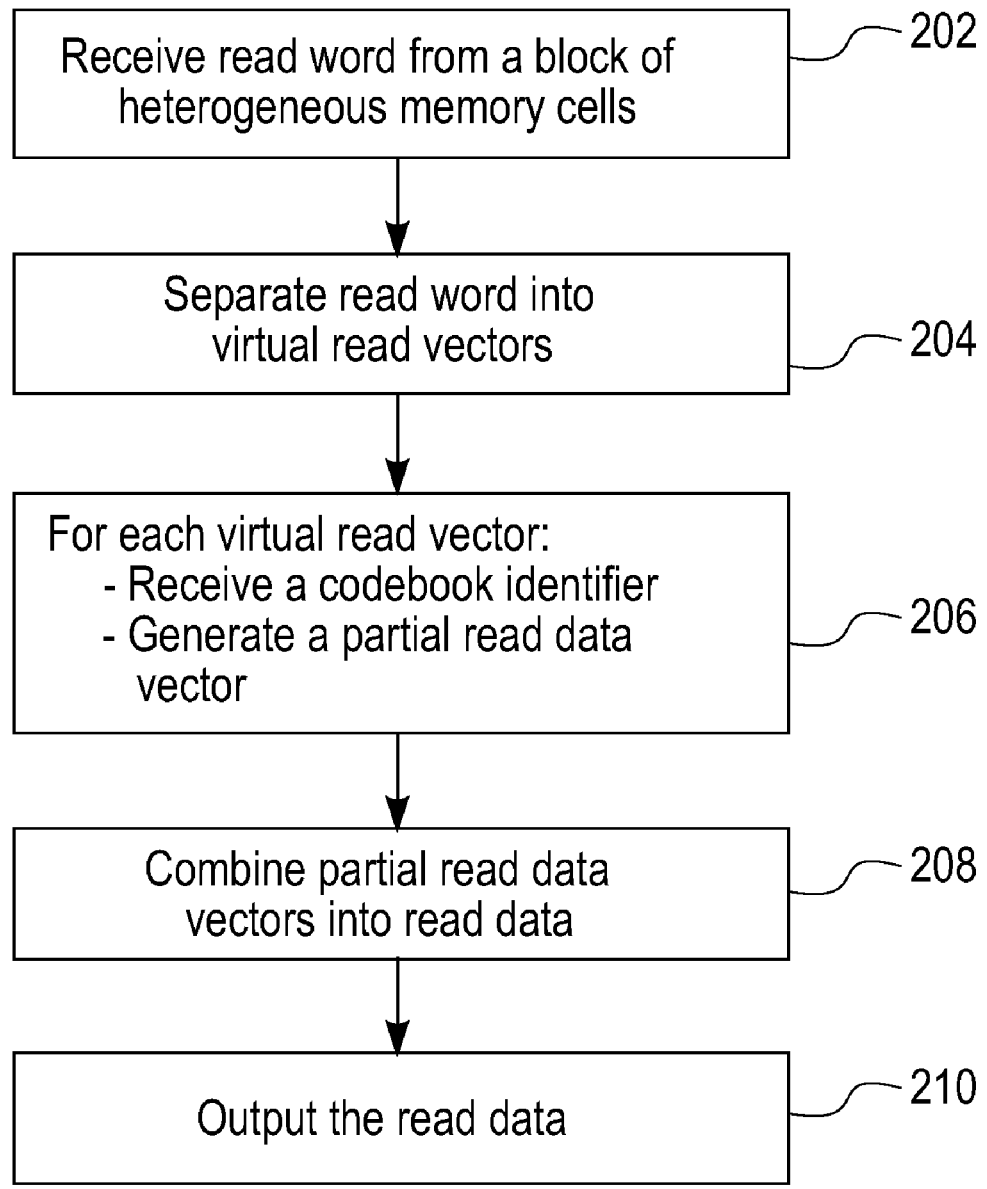
FIG. 2 illustrates a process for reading data that may be implemented by an exemplary embodiment.

FIG. 2 illustrates a process for reading data that may be implemented by an exemplary embodiment. In this example, it is assumed that the decoder utilized by the read process does not know (i.e., is unaware of) the physical characteristics of the block of heterogeneous memory cells. The decoder does know the range of the physical characteristics (e.g., between a resistance level of zero and four) and knows the indices of codebooks used during the last write process to the block. At block 202, data is read (i.e., a "read word") from a block of heterogeneous memory cells. At block 204, the read word is separated into virtual read vectors based on the range of the physical values. For example, if the range covers four values, then the read word is separated into two virtual read vectors. At block 206, processing is performed for each of the virtual read vectors. First, a codebook identifier is received (e.g., from a storage location, alternatively it could be a fixed or pre-specified codebook). The codebook identifier identifies the codebook utilized by the encoder when the data was written to the memory. Next, a partial read data vector is generated by utilizing the identified codebook. In an exemplary embodiment, the codebook is a linear code, and the partial read data vector is generated by multiplying the virtual read vector by the matrix which represents the identified codebook. At block 208, the partial read data vectors are combined into read data (also called the read message). At block 210, the read data is output (e.g., to the read requestor).

Figure 3:
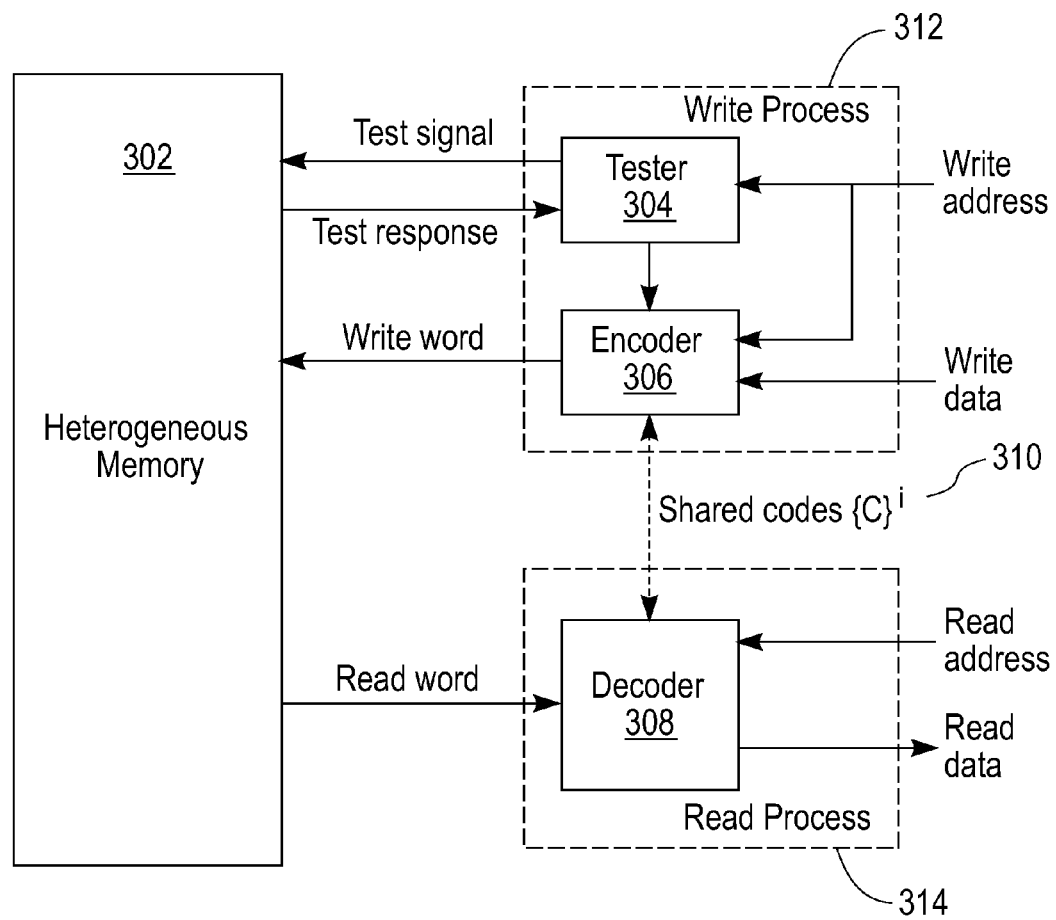
FIG. 3 illustrates a block diagram of a system for storing data in a heterogeneous memory that may be implemented by an exemplary embodiment.

FIG. 3 illustrates a block diagram of a system for storing data in a heterogeneous memory that may be implemented by an exemplary embodiment. The system depicted in FIG. 3 includes heterogeneous memory 302 including blocks of memory cells, a tester 304 for determining physical characteristics of the memory cells, an encoder 306 for receiving write data and generating a write word for storage in the memory cells, and a decoder 308 for receiving a read word from the memory and generating read data. An exemplary write process 312 such as that described in reference to FIG. 1 utilizes the tester 304, the encoder 306, and shared codes 310 (e.g., a codebook identifier and codebook) utilized by both the write process 312 and the read process 314. An exemplary read process 314 such as that described in reference to FIG. 2 utilizes the decoder 308 and the shared coded 310.

Figure 4:
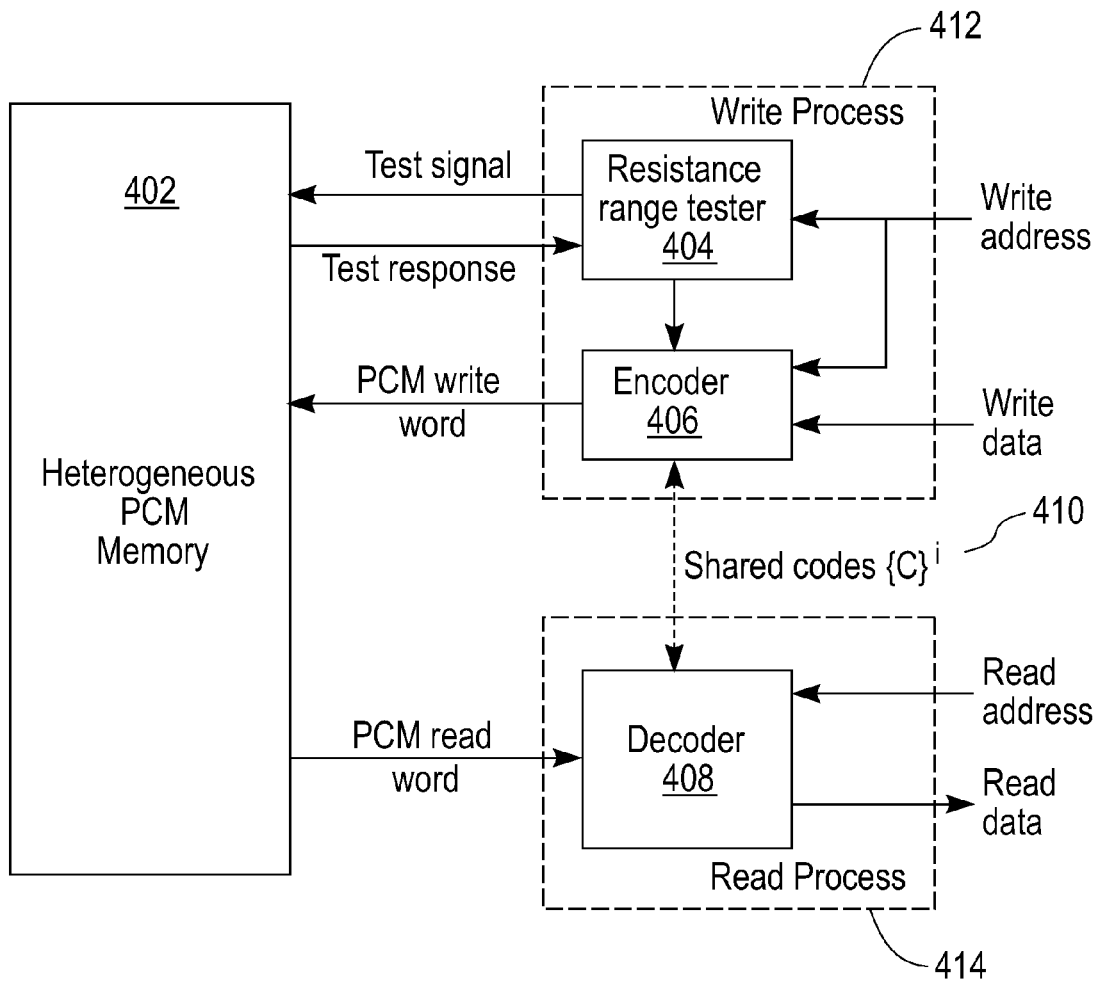
FIG. 4 illustrates a block diagram of a system for storing data in a phase change memory (PCM) that may be implemented by an exemplary embodiment.

FIG. 4 illustrates a block diagram of a system for storing data in a phase change memory (PCM) that may be implemented by an exemplary embodiment. The system depicted in FIG. 4 includes heterogeneous PCM memory 402 including blocks of memory cells, a resistance range tester 404 for determining resistance levels associated with the memory cells (i.e., a physical characteristic in this example is a resistance level), an encoder 406 for receiving write data and generating a PCM write word for storage in the memory cells, and a decoder 408 for receiving a PCM read word from the PCM memory 402 and generating read data. An exemplary write process 412 to a PCM memory utilizes the resistance range tester 404, the encoder 406 and shared codes 410 utilized by both the write process 412 and the read process 414. An exemplary read process 414 to a PCM memory 402 utilizes the decoder 408 and the shared codes 410. In another embodiment the resistance range tester can be replaced with a resistance tester, which determines the set of resistance levels supported by each set, in the case where this set is non-contiguous.

In an alternate embodiment, the memory is flash memory and the memory cells are flash memory cells. In this embodiment, the physical characteristic used to store information is a floating gate charge. The heterogeneity in the flash memory arises from the variation in the charge storage characteristics of the flash cells.

Figure 5:
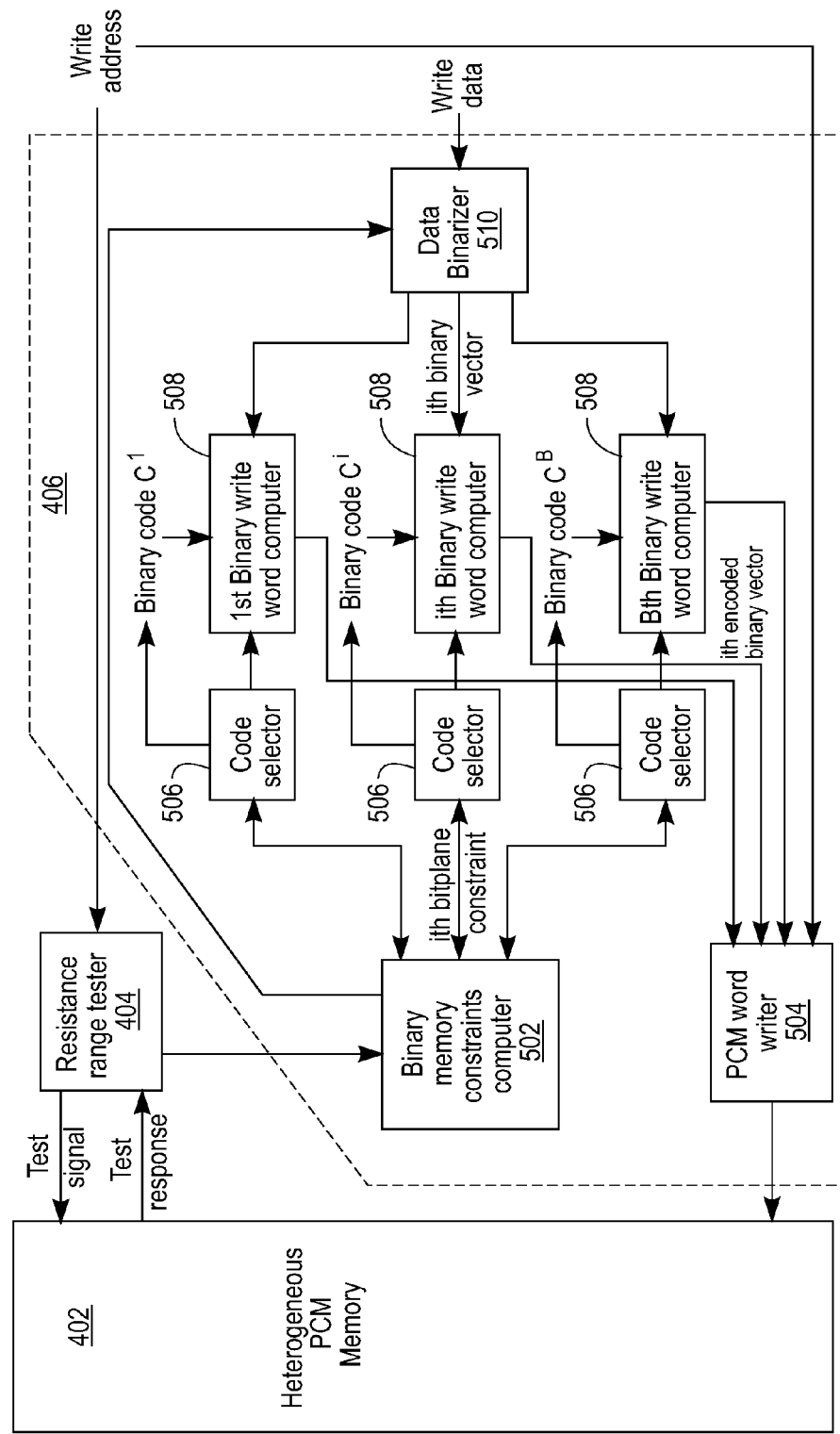
FIG. 5 illustrates a block diagram of a system for writing data in a PCM that may be implemented by an exemplary embodiment.

FIG. 5 illustrates a block diagram of a system for storing data in a PCM memory 402 that may be implemented by an exemplary embodiment. FIG. 5 depicts a more detailed view of an exemplary encoder 406 that may be implemented by an exemplary embodiment. The exemplary encoder 406 includes a binary memory constraints computer 502, code selectors 506, binary write word computers 508, a data binarizer 510 and a PCM word writer 504. The data binarizer 510 receives the write data and separates it into multiple partial write data vectors, each of which is associated with one virtual memory. In an exemplary embodiment the write-data is binary, and the data binarizer splits it into multiple binary vectors with the number of bits in the ith binary vector decided by determining the number of bits that can be written into the ith virtual memory. This is computed as a function of the memory constraints computed by the binary memory constraints computer 502.

In another exemplary embodiment, the write-data is non-binary, and the data binarizer 510 converts it into binary and then splits it into multiple binary vectors. In the embodiment depicted in FIG. 5, the virtual memory is represented as a virtual memory vector. In an exemplary embodiment, this number of virtual memories depends on the number of possible resistance values in the PCM cells as measured by the resistance range tester 404. The binary memory constraints computer 502 receives the supported resistance levels for each cell in the block of memory cells. Based on the range of resistance levels, the binary memory constraints computer 502 identifies constraints associated with the virtual memories. The code selectors 506 select a codebook for each virtual memory based on the number of memory cells in the block and on the constraints for the virtual memory. In an alternate exemplary embodiment, the codebook is fixed and known a-priori to both read and write processes, and thus the code selectors are unnecessary. The binary write word computers 508 calculate virtual write vectors. In an exemplary embodiment, the codebook is a linear code assigning syndromes to virtual write vectors, and the virtual write vector for a given partial write data vector is calculated by computing a vector which is consistent with the constraint vector generated for the virtual memory, and whose syndrome is equal to the partial write vector. Thus, the virtual write vectors are calculated by solving the equation $Hc=m$ for c, while taking into account the constraints for the virtual memory; where H is the code-matrix corresponding to a selected linear code for the virtual memory, "m" is the partial write data vector corresponding to the virtual memory, and the product $Hc$ is the syndrome corresponding to c. The equation $Hc=m$ will, in general, have multiple possible solutions for c, each of which is one representation of the partial write vector m; the desired representation is the solution vector c which is consistent with the virtual memory constraints. The PCM word writer 504 combines the virtual write vectors into a write word to be written to the PCM memory 402.

Figure 6:
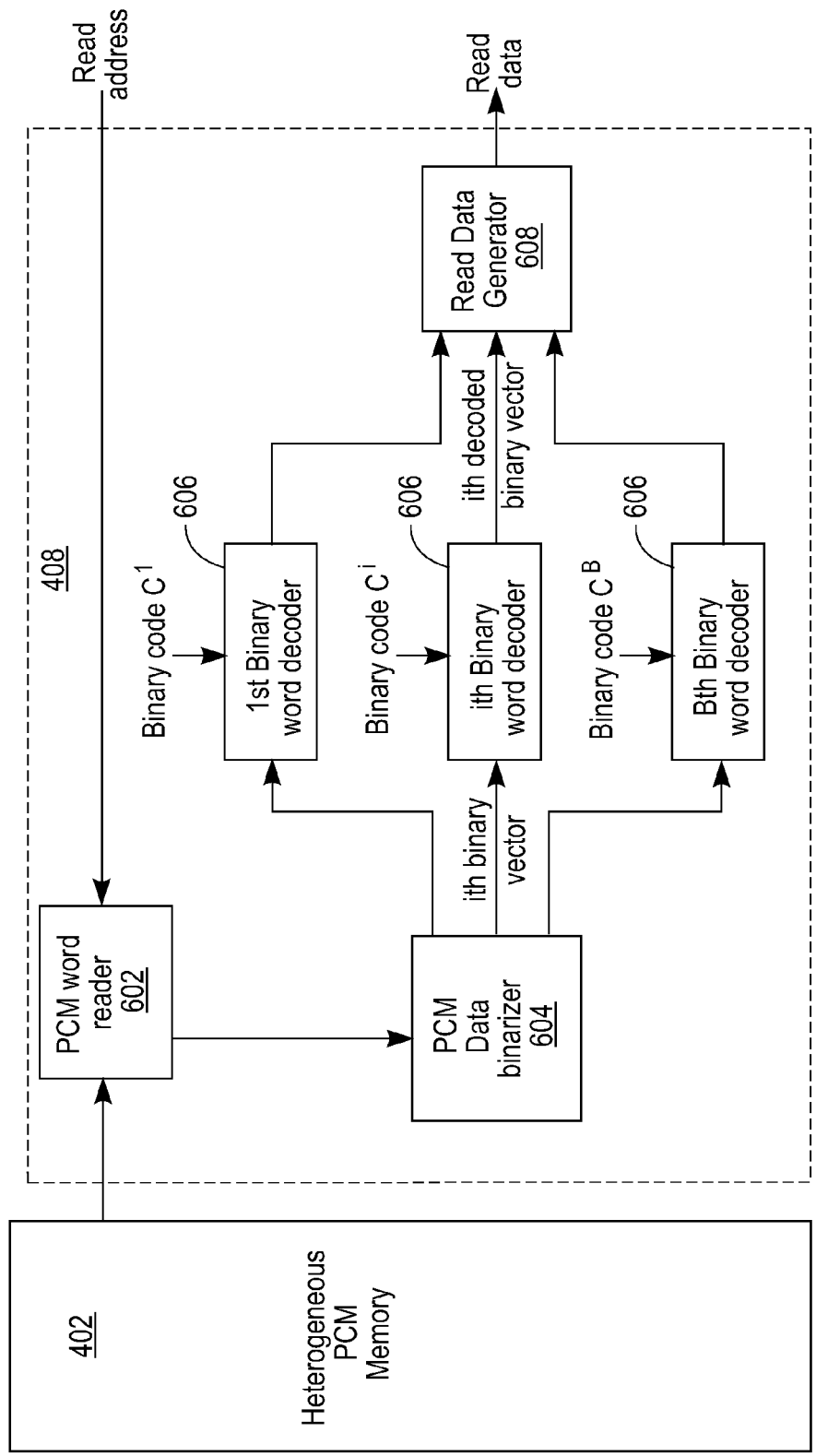
FIG. 6 illustrates a block diagram of a system for reading data from a PCM memory that may be implemented by an exemplary embodiment.

FIG. 6 illustrates a block diagram of a system for reading data from a PCM memory 402 that may be implemented by an exemplary embodiment. FIG. 6 depicts a more detailed view of an exemplary decoder 408 that may be implemented by an exemplary embodiment. The exemplary decoder 408 includes a PCM word reader 602, a data binarizer 604, binary word decoders 606 and a read data generator 608. The PCM word reader 602 reads each cell in the block of cells specified by the read address. The read word is received by the data binarizer 604, which breaks the read word into virtual read vectors based on the range of possible resistance values. Each virtual read vector is sent to a separate binary word decoder 606. The binary word decoder 606 has access to an index or other identifier for the codebook that was utilized to write the read word to the PCM 402. In case of linear codes, the binary word decoder 606 multiplies the code-matrix corresponding to the identified codebook, by the contents of the virtual read vector to create a partial read data vector. The read data generator 608 combines the partial read data vectors into the read data. The read data is then output (e.g., to the data requestor).

Figure 7:
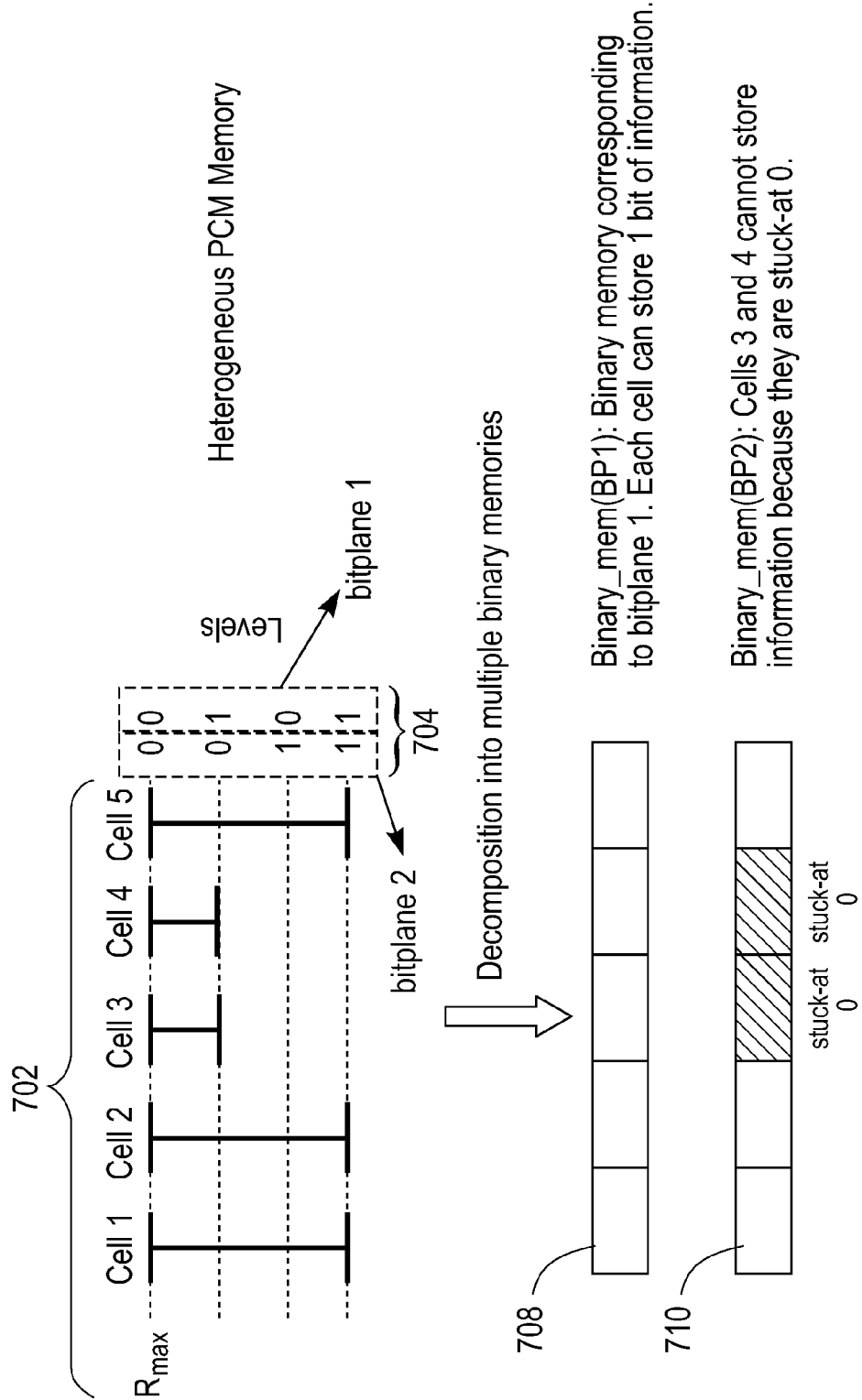
FIG. 7 illustrates a conceptual decomposition of heterogeneous memory into multiple virtual binary memories that may be implemented by an exemplary embodiment.

FIG. 7 illustrates a conceptual decomposition of heterogeneous memory into multiple virtual binary memories that may be implemented by an exemplary embodiment. The example depicted in FIG. 7 includes a memory block 702 having five heterogeneous memory cells. The resistance range level for the memory cells has four values (zero, one, two, three) and therefore the physical characteristic of resistance range, can be represented in two bitplanes 704. Each bitplane in the binarization of the cell resistance levels corresponds to one of the virtual memories (also referred to as "binary memories"). FIG. 7 depicts binary memory one 708 and binary memory two 710. The heterogeneity of the original memory block 702 manifests itself in the form of constraints on the virtual memory cells; specifically, cell three and cell four cannot store levels "10" and "11", thus in the binary memory two 710 the corresponding positions are stuck at "0"; i.e., their value cannot be changed to "1". In an exemplary embodiment, the constraint on a virtual memory is represented as a constraint vector. For example the constraint vector for binary memory two 710 may be represented as BP2:b=(3,4),v=(0,0).

Figure 8:
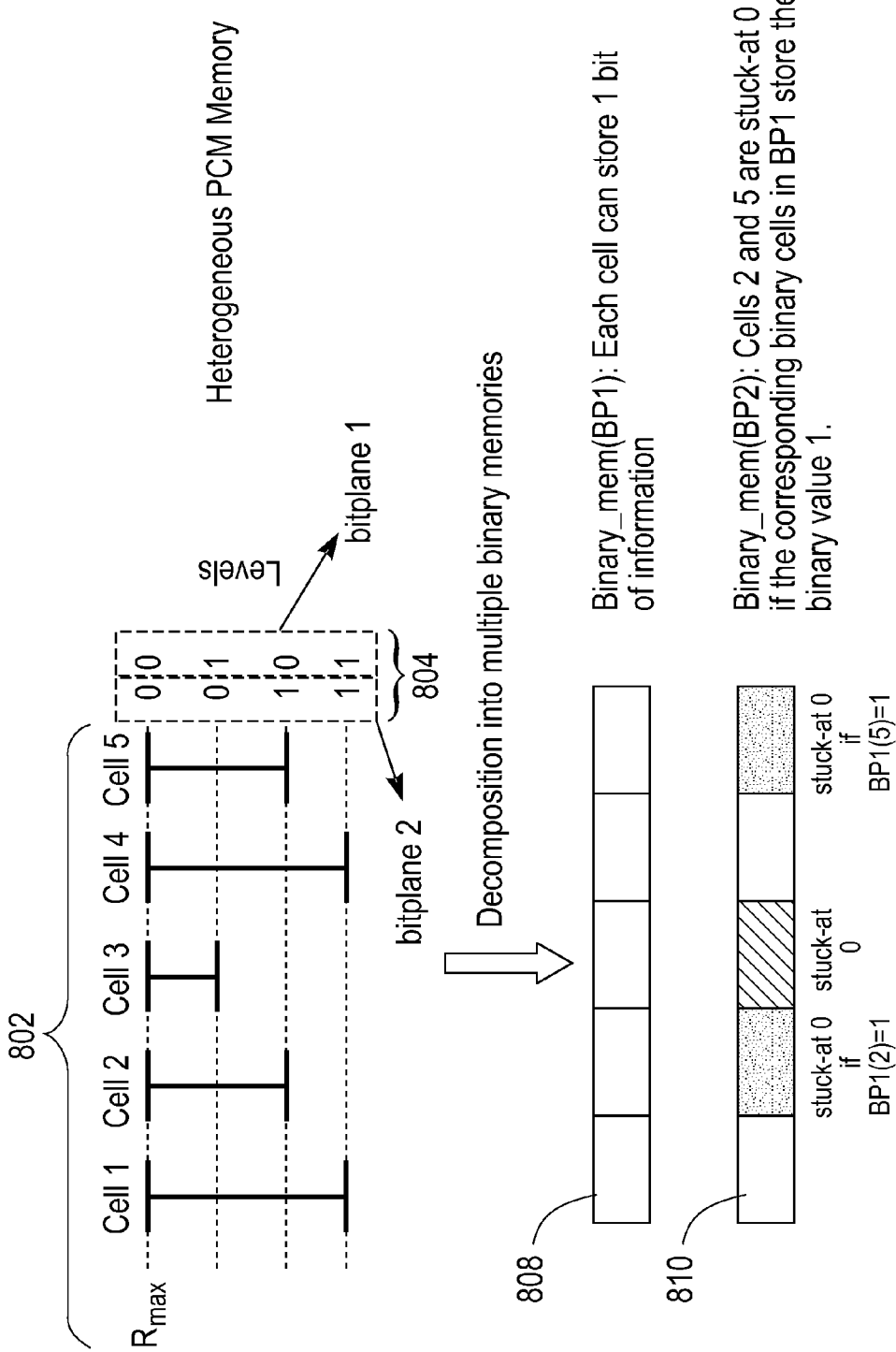
FIG. 8 illustrates a conceptual decomposition of heterogeneous memory constraints into equivalent constraints on a set of virtual binary memories that may be implemented by an exemplary embodiment.

FIG. 8 illustrates a conceptual decomposition of heterogeneous memory constraints into equivalent constraints on a set of virtual binary memories that may be implemented by an exemplary embodiment. FIG. 8 is similar to FIG. 7 in that there is a memory block 802 and it requires two bitplanes 804 to describe the physical characteristics of the memory block 802. In this example, cells two and five cannot store the level "11", and therefore if cells 2 and/or five in binary memory one 808 is "1", then the corresponding cells in binary memory two 810 are stuck at "0". This example illustrates that the constraints for binary memory two 810 may depend upon the binary data stored in binary memory one 808.

Figure 9:
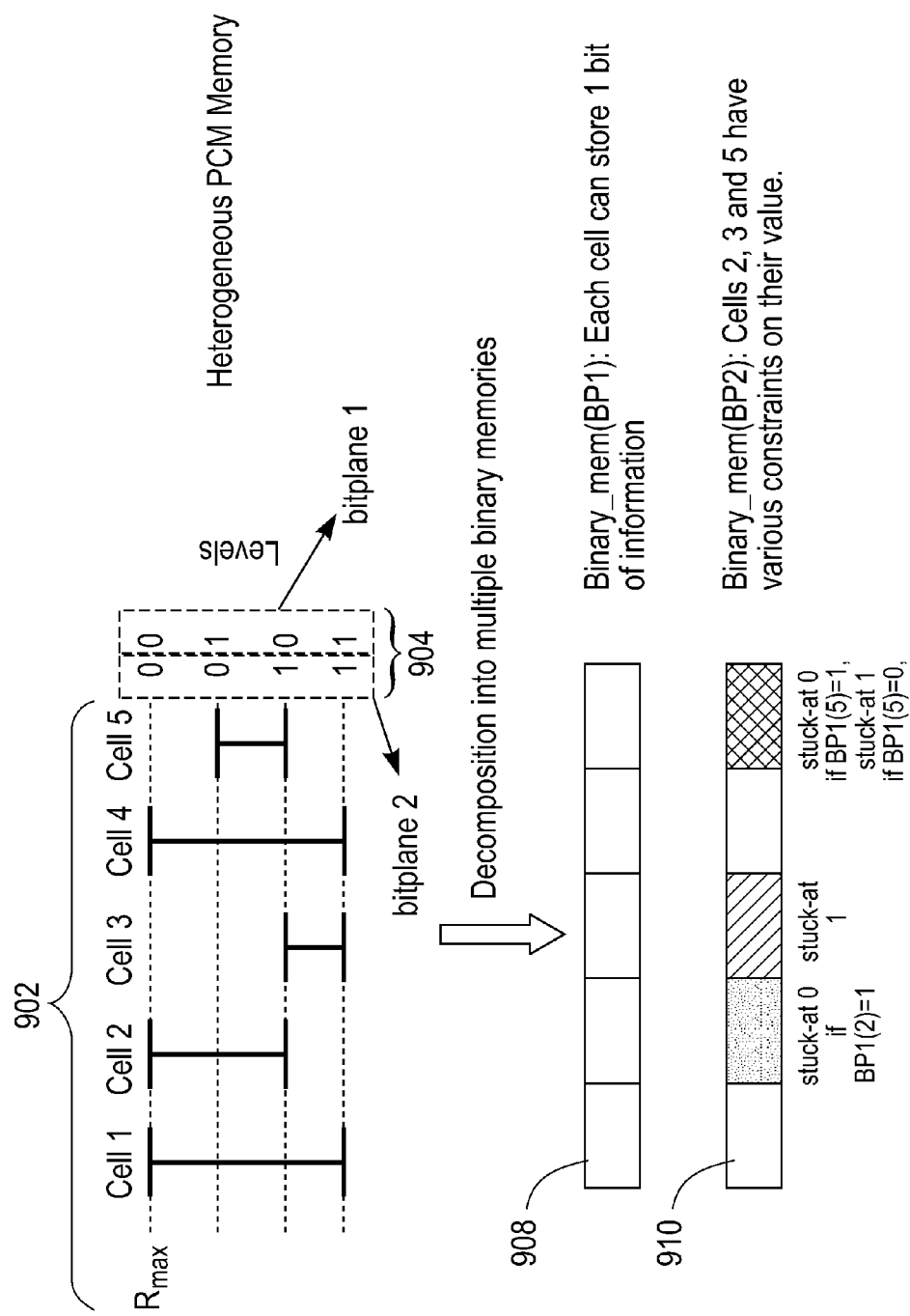
FIG. 9 illustrates a conceptual decomposition of heterogeneous memory constraints into equivalent constraints on a set of virtual binary memories that may be implemented by an exemplary embodiment.

FIG. 9 illustrates a conceptual decomposition of heterogeneous memory constraints into equivalent constraints on a set of virtual binary memories that may be implemented by an exemplary embodiment. FIG. 9 is similar to FIGS. 7 and 8 in that there is a memory block 902 and it requires two bitplanes 904 to describe the physical characteristics of the memory block 902. In this example, cell five in bitplane two 910 is stuck at "0" if cell five in bitplane one 908 is equal to "1". In addition, cell five in bitplane two 910 is stuck at "1" if cell five in bitplane one 908 is equal to "0".

Figure 10:
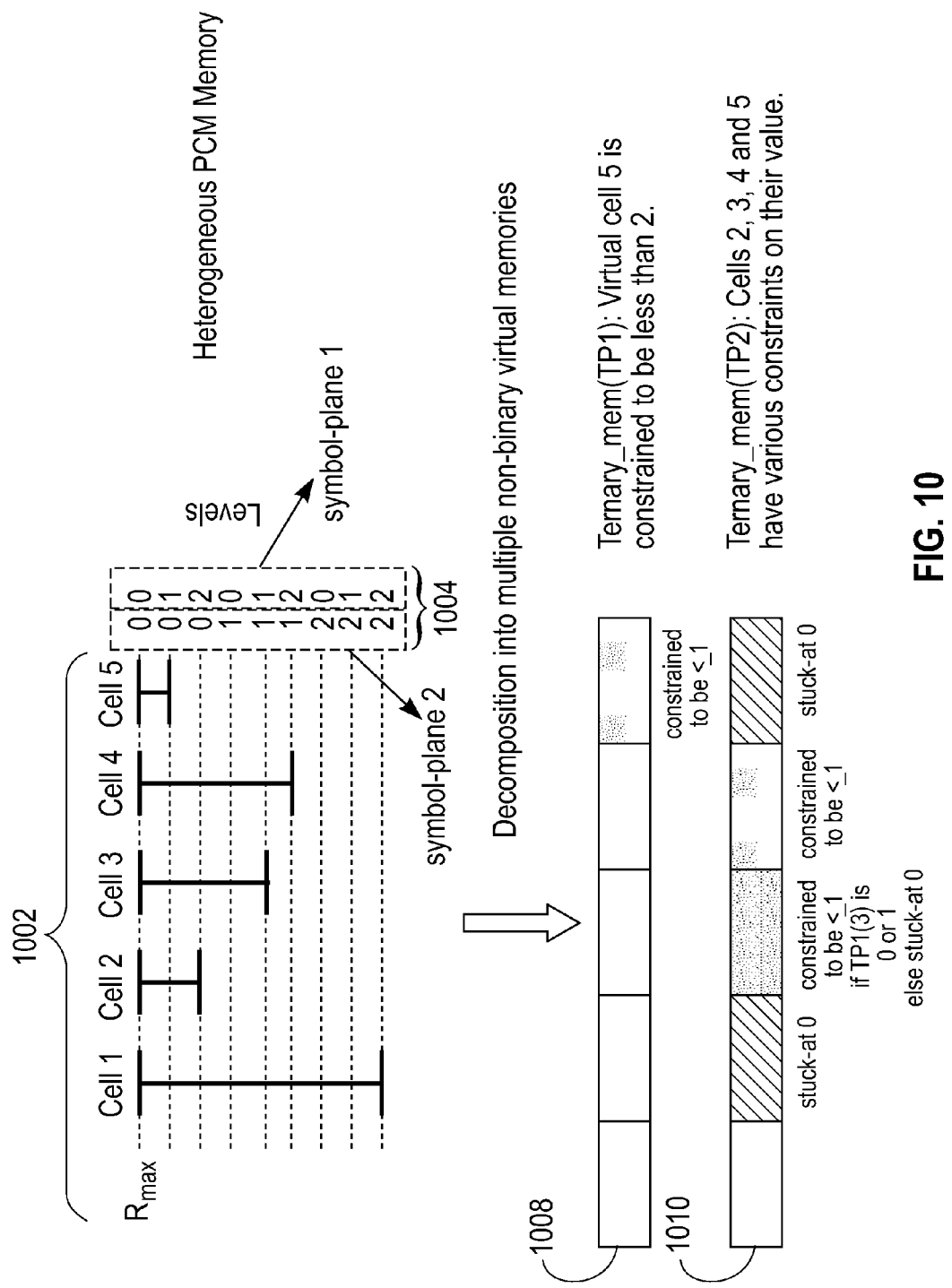
FIG. 10 illustrates a conceptual decomposition of heterogeneous memory constraints into equivalent constraints on a set of virtual non-binary memories that may be implemented by an exemplary embodiment.

The virtual memories for which such constraints are computed may be non-binary, which may prove convenient, for example, in reducing the number of virtual write vectors which need to be computed. FIG. 10 illustrates a conceptual decomposition of heterogeneous memory constraints into equivalent constraints on a set of virtual ternary memories that may be implemented by an exemplary embodiment. The example depicted in FIG. 10 includes a memory block 1002 having five heterogeneous memory cells. The resistance range level for the memory cells has nine values (zero, one, two, three, four, five, six, seven, eight, and nine) and therefore the physical characteristic of resistance range, can be represented in two ternary symbol-planes 1004. Each ternary symbol-plane corresponds to one of the virtual memories (also referred to as "ternary memories"). FIG. 10 depicts ternary memory one 1008 and ternary memory two 1010. The heterogeneity of the original memory block 1002 manifests itself in the form of constraints on the virtual memory cells; for example, cell five cannot support any level greater than level one ("01" in ternary), and thus the corresponding virtual cell in ternary memory one 1008 is constrained to be less than two, and the corresponding cell in ternary memory two 1010 is stuck-at 0. Similarly, virtual cell two in ternary memory two 1010 is stuck at 0 since cell 2 cannot support any level greater than level two ("02" in ternary). As another example, cell 3 only supports levels "00", "01", "02", "10" and "11". Thus virtual cell 3 is ternary memory two 1010 is constrained to be "0" or "1" if the symbol written into ternary memory one 1008 at position 3 is "0" or "1", and otherwise is stuck at "0".

Figure 11:
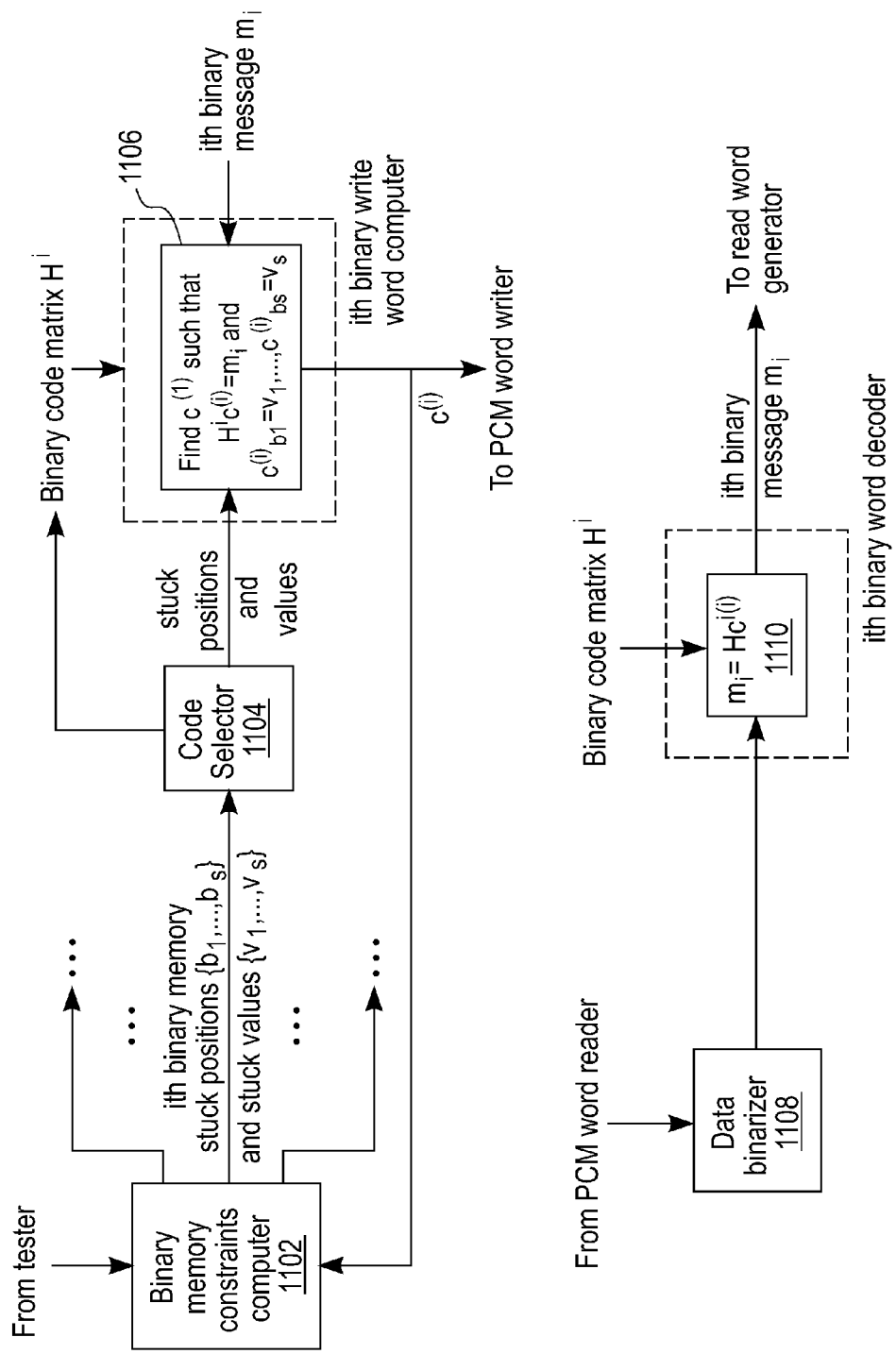
FIG. 11 illustrates a block diagram of a binary write word computer and binary word decoder that may be implemented by an exemplary embodiment.

FIG. 11 illustrates a block diagram of a binary write word computer 1106 and binary word decoder 1110 that may be implemented by an exemplary embodiment. The write process generates write data, c, also referred to as a virtual write vector for the $i^{th}$ virtual memory. The write process includes a binary memory constraints computer 1102, a code selector 1104, and a binary write word computer 1106. The binary memory constraints computer 1102 receives the physical characteristics from a tester, as well as the virtual write vectors corresponding to previously written virtual memories, and generates a constraint vector describing the stuck positions and stuck values for one of the bitplanes. The constraint vectors are input to the code selector 1104, which selects a codebook (in this case represented by a binary code matrix) based on contents of the constraint vector and on the number of memory cells in the block of memory cells. In addition, the code selector 1104 passes the constraint vector to the binary word write computer 1106. The binary write word computer 1106 inputs the codematrix, H, the constraint vector, including b and v, and the write data, m, to calculate a virtual write vector, c. The virtual write vector, c, is calculated by solving Hc=m for "c", while still meeting the constraints specified by the constraint vector. The virtual write vector is input to the PCM word writer for combining the virtual write vectors for the block into a write word. In addition, the virtual write vector is input to the binary memory constraints computer 1102 for use in developing the constraint vector for the next virtual memory.

As depicted in the exemplary embodiment depicted in FIG. 11, the read process utilizes a data binarizer 1108, and a binary word decoder 1110. A read word from a PCM word reader is received at the data binarizer 1108. The data binarizer separates the read word into a plurality of virtual read vectors. One of the virtual read vectors is input to the binary word decoder 1110 along with the codebook that was utilized when the data was written to the memory block. A partial read data vector (also referred to as a binary message) is generated by multiplying the virtual read vector by the codebook. The partial read data vector is sent to a read word generator, which combines the partial read data vectors from each of the virtual memories in the memory block into read data.

The example depicted in FIG. 11 may be generalized to cases where non-binary memory constraints and code matrices are used.

Figure 12:
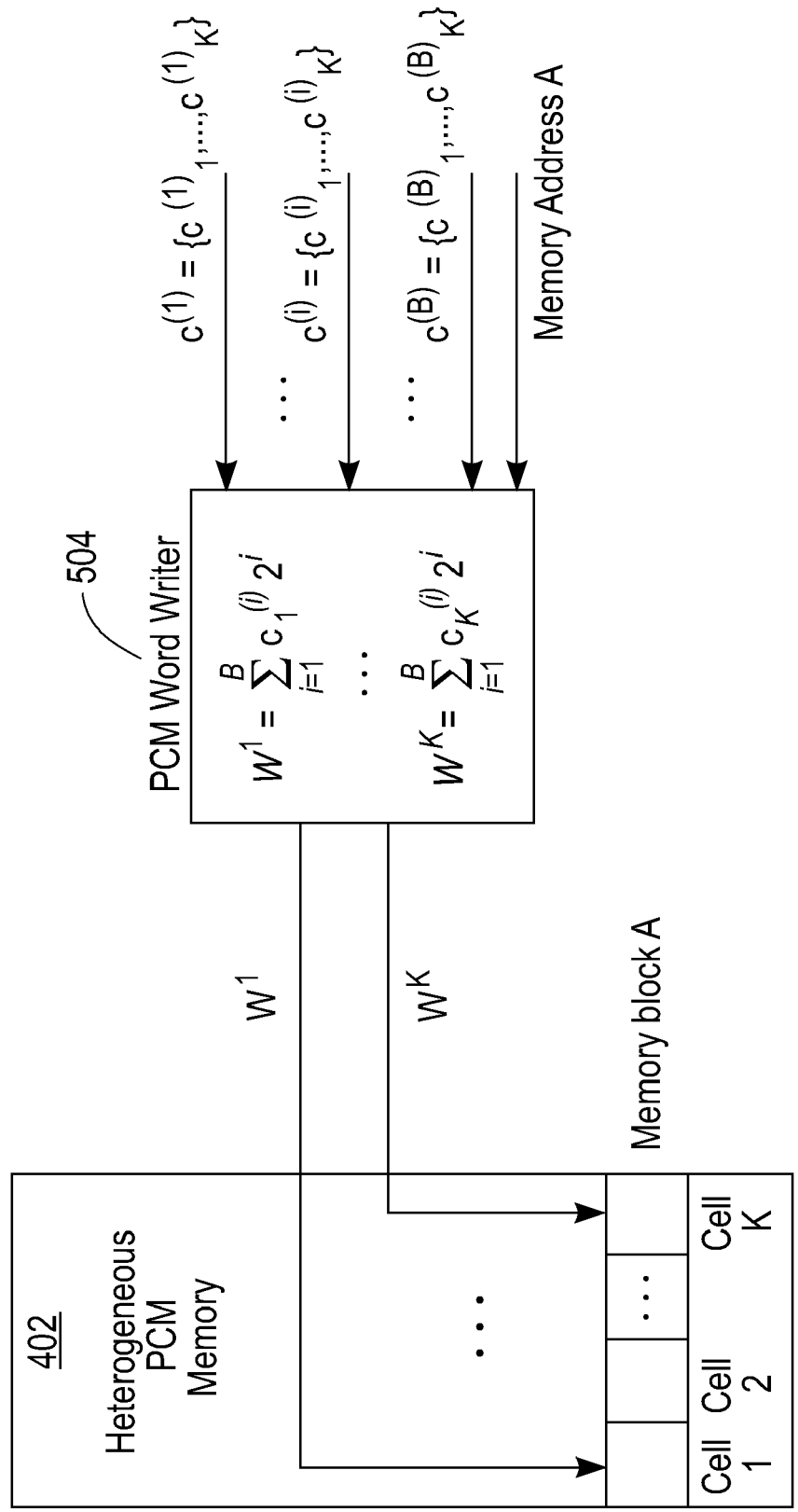
FIG. 12 illustrates a block diagram of a word writer that may be implemented by an exemplary embodiment.

FIG. 12 illustrates a block diagram of a word writer, such as PCM word writer 504, that may be implemented by an exemplary embodiment. The PCM word writer 504 combines the virtual write vectors ($c^1 \ldots c^i \ldots c^B$) into a write word ($W^1 \ldots W^K$) to be written to the PCM memory 402. "K" is the number of cells in the block of memory cells and "B" is the number of virtual memories in the block of memory cells. FIG. 12 depicts an example manner of determining the contents of the write word, other manners of combining the virtual write vectors to create a write word may also be implemented. Note that the manner of generation of the virtual write vectors (in particular their consistency with the virtual memory constraints) ensures that each symbol in the write word is a level supported by the cell to which it is written. This ensures that the heterogeneous memory is correctly written to.

Figure 13:
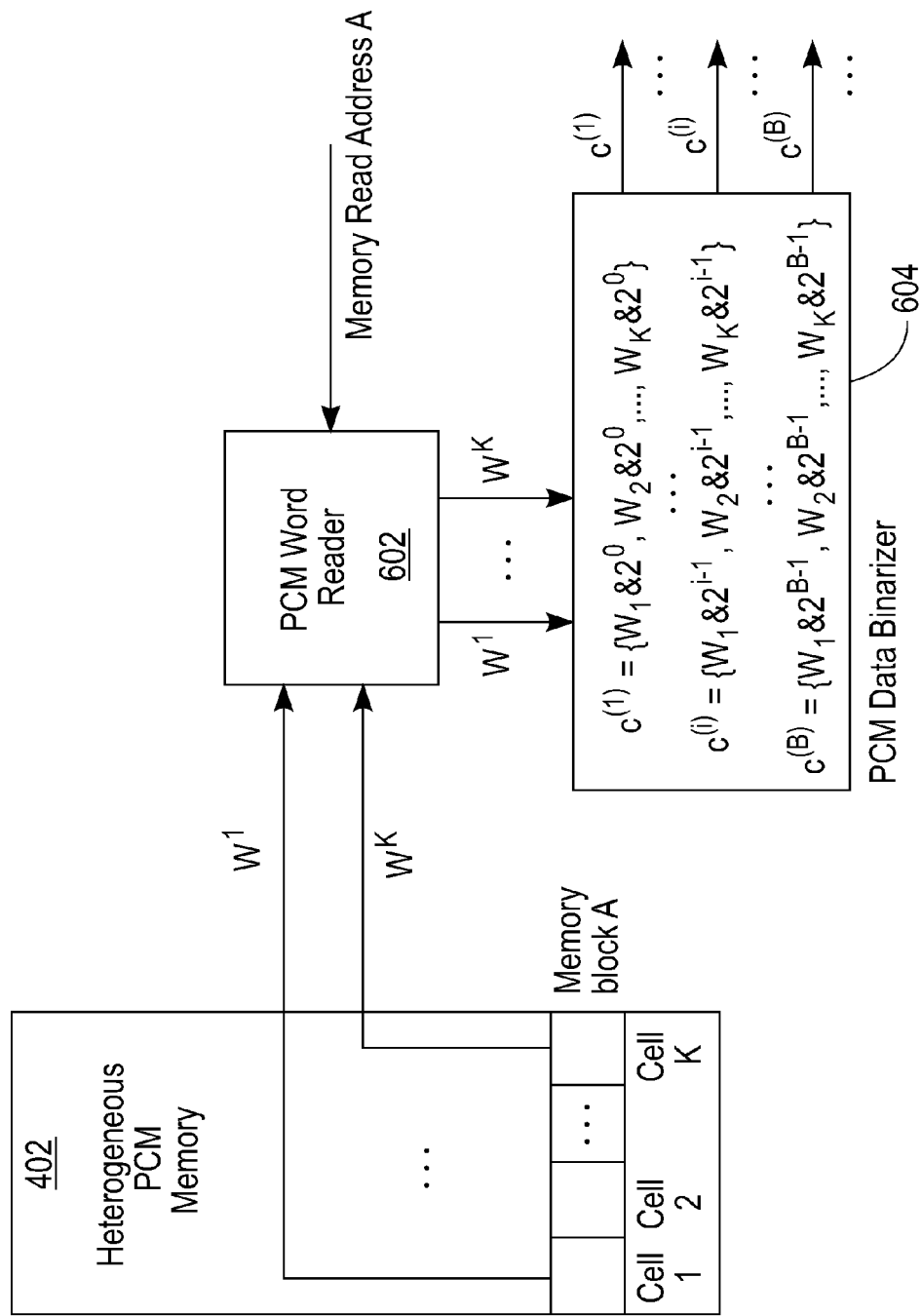
FIG. 13 illustrates a block diagram of a PCM data binarizer that may be implemented by an exemplary embodiment.

FIG. 13 illustrates a block diagram of the PCM data binarizer, such as data binarizer 604, that may be implemented by an exemplary embodiment. The PCM word reader 602 receives a read word ($W^1 \ldots W^K$) from the PCM memory at the read memory read address and separates the read word into a plurality of virtual read vectors ($c^1 \ldots c^i \ldots c^B$). FIG. 13 depicts an example manner of determining the contents of the write word, other manners of performing the separating may also be implemented.

Figure 14:
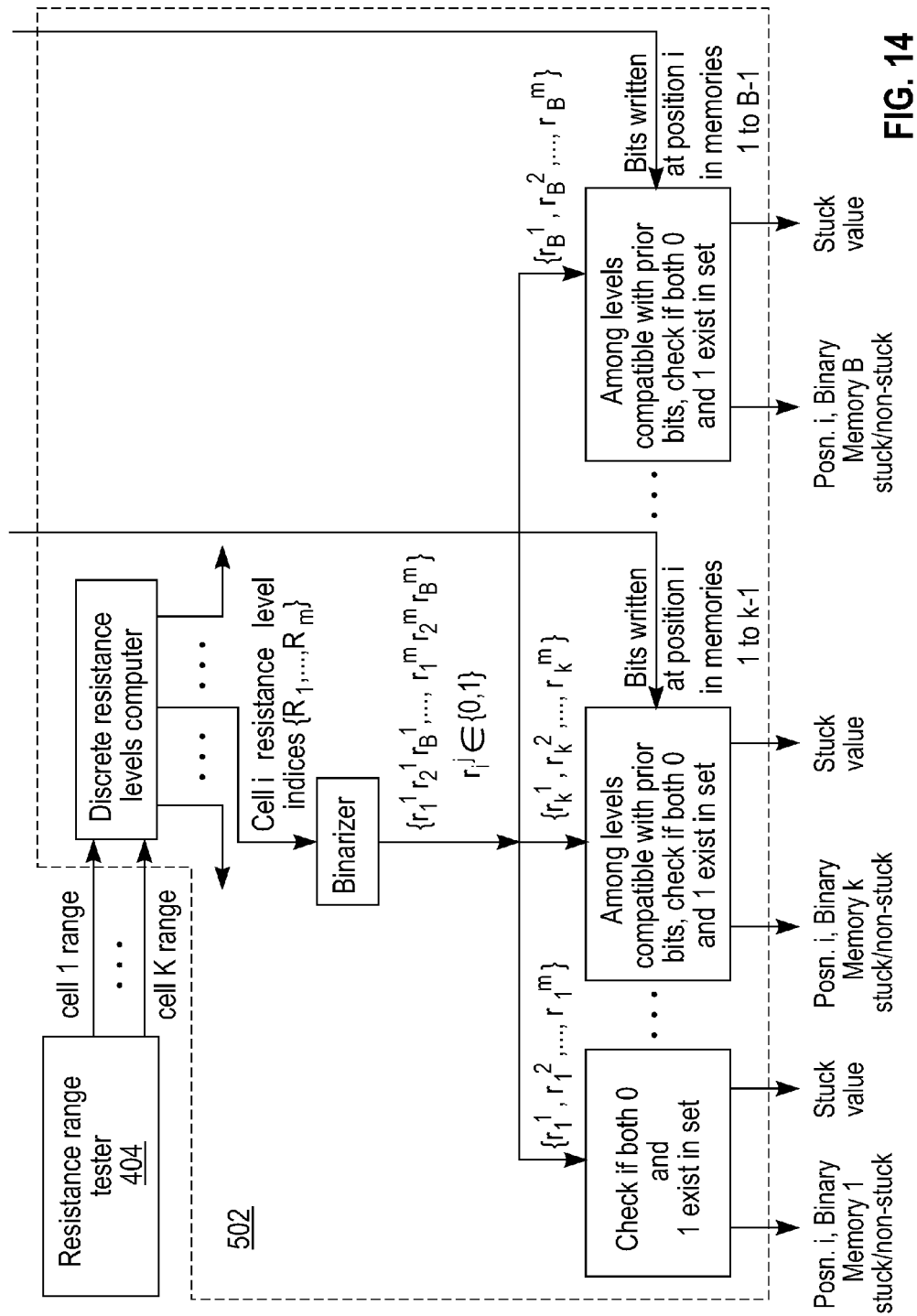
FIG. 14 illustrates a block diagram of a binary memory constraints computer that may be implemented by an exemplary embodiment.

FIG. 14 illustrates a block diagram of a binary memory constraints computer, such as binary memory constraints computer 502, that may be implemented by an exemplary embodiment. FIG. 14 illustrates computation of constraints (stuck bits and values) for the "B" virtual memories corresponding to cell "i". The resistance range, is measured by the resistance range tester 404, is used to determine the set of integer-valued resistance level indices supported by cell "i". Based on this set, and the bits written at position "i" in virtual memories 1 to k−1, it can be determined if position "i" in binary memory "k" is stuck (and if so, what the stuck value is).

Figure 15:
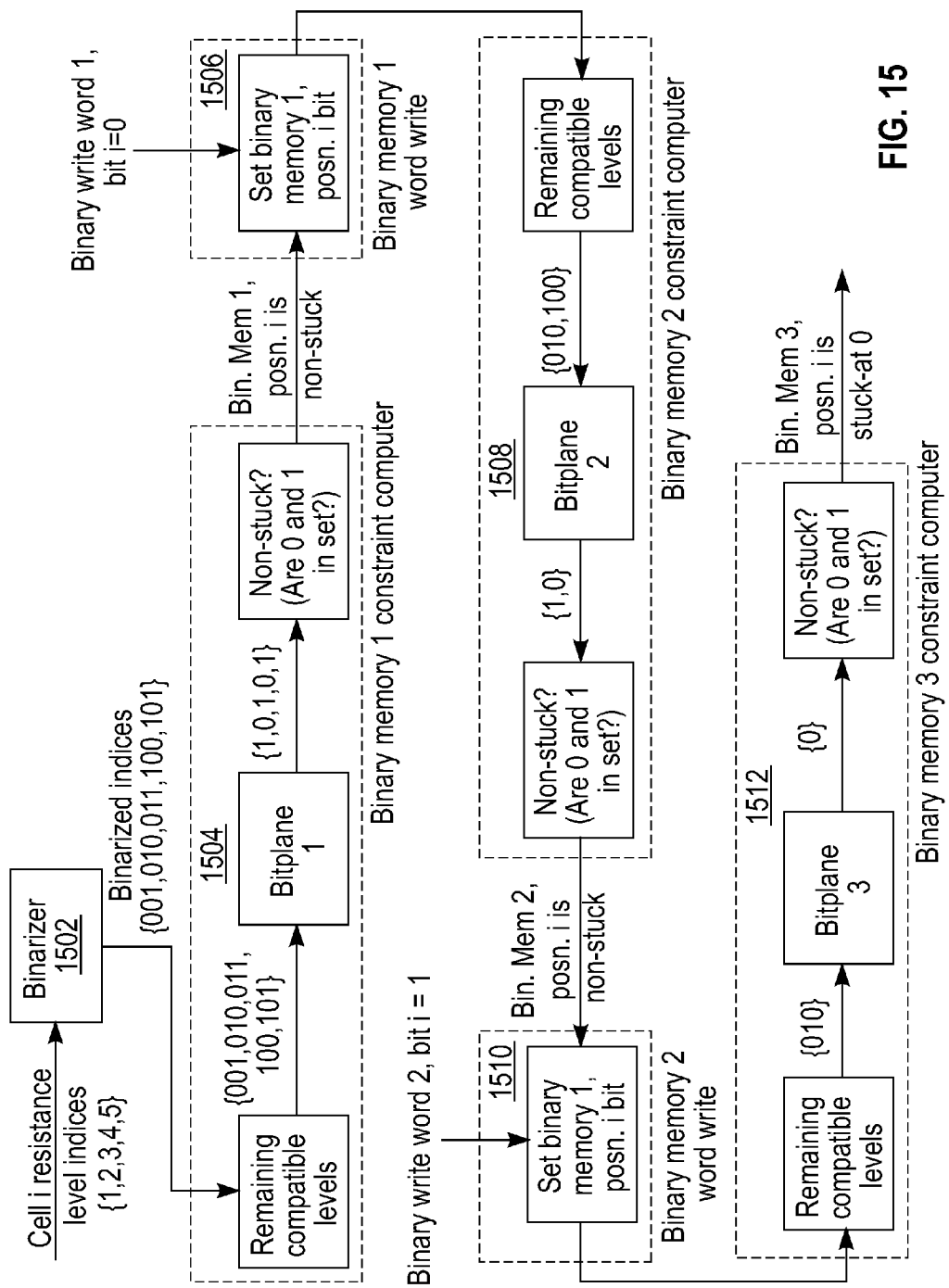
FIG. 15 illustrates a process for computing binary constraints that may be implemented by an exemplary embodiment.

FIG. 15 illustrates a process for computing binary constraints that may be implemented by the block diagram depicted in FIG. 14. In the example depicted in FIG. 15, cell "i" can support resistance levels represented by indices 1, 2, 3, 4 and 5. This information is input the binarizer 1502, which creates binarized indices corresponding to the cell level indices. Because there are five or more resistance levels in the PCM memory, at least three virtual memories (also referred to as binary memories) exist. FIG. 15 shows how the memory constraints corresponding to position "i" in each of the three virtual memories are computed. The binarized indices are input to a binary memory one constraint computer 1504 which determines what values are contained in the least significant bits of the binarized indices. In this example, they include both "0"s and "1"s, so binary memory one, position "i" is unstuck.

At block 1506, a value of "0" is written to bit "i" in binary memory one. Input to the writing includes the constraint vector associated with binary memory one, the constraints specify that bit "i" in binary memory one is unstuck so any value may be written. Processing continues to the binary memory two constraint computer 1508 with input including the data value written to bit "i" in binary memory one. The remaining compatible levels are calculated given that a "0" was written to bit "i" in binary memory one. As depicted in the binary memory two constraint computer 1508, the remaining compatible levels are (010 and 100) because a "0" is located in the least significant bit (i.e., in binary memory one). The binary memory two constraint computer determines that binary memory two, position "i" is unstuck.

At block 1510, a value of "1" is written to bit "i" in binary memory two using the constraint vector from the binary memory two constraint computer 1508 as input. Next, processing continues at the binary memory three constraint computer 1512 with input including the data values written to bit "i" in binary memories one and two. The remaining compatible levels are calculated given that a "0" was written to bit "i" in binary memory one and a "1" was written to bit "i" in binary memory two. As depicted in the binary memory three constraint computer 1512, the remaining compatible level is (010). The binary memory three constraint computer 1512 determines that binary memory three, position "i" is stuck at "0". This constraint information is input to a binary memory three word write process.

In one embodiment, to compute the virtual write vector c, it is required to solve the equation Hc=m such that c satisfies certain stuck position constraints. This can be done by multiple methods, including many methods that are known in literature. In an exemplary embodiment, the matrix H is computed by computing the parity check matrix of an irregular low density parity check (LDPC) code and the write process uses Gaussian elimination to compute the vector. In another exemplary embodiment, the matrix H is computed by computing a random matrix drawn uniformly from a finite alphabet and the write process uses Gaussian elimination to compute the vector. In another exemplary embodiment, the matrix H is computed by computing the transpose of the generator matrix of a Luby transform (LT) code, and the write process uses peeling to compute the virtual write vector "c". In another embodiment, the matrix H represents a convolutional code, and the encoding algorithm uses a trellis based cost minimization to compute the virtual write vector "c", wherein the cost associated with each trellis path is a function of the resistance level of each cell and the value to be written in that cell. In another embodiment the matrix H is computed by computing the generator matrix or parity check matrix of an algebraic code such as a BCH or Reed-Solomon code. In another exemplary embodiment, the write process solves a linear program to find the vector "c" which satisfies linear constraints on the value of each component $c^i$ imposed by the range of resistance values which can be taken by each memory cell in the virtual memory, such that the multiplication of the matrix H and c is the write vector m to be encoded.

Figure 16:
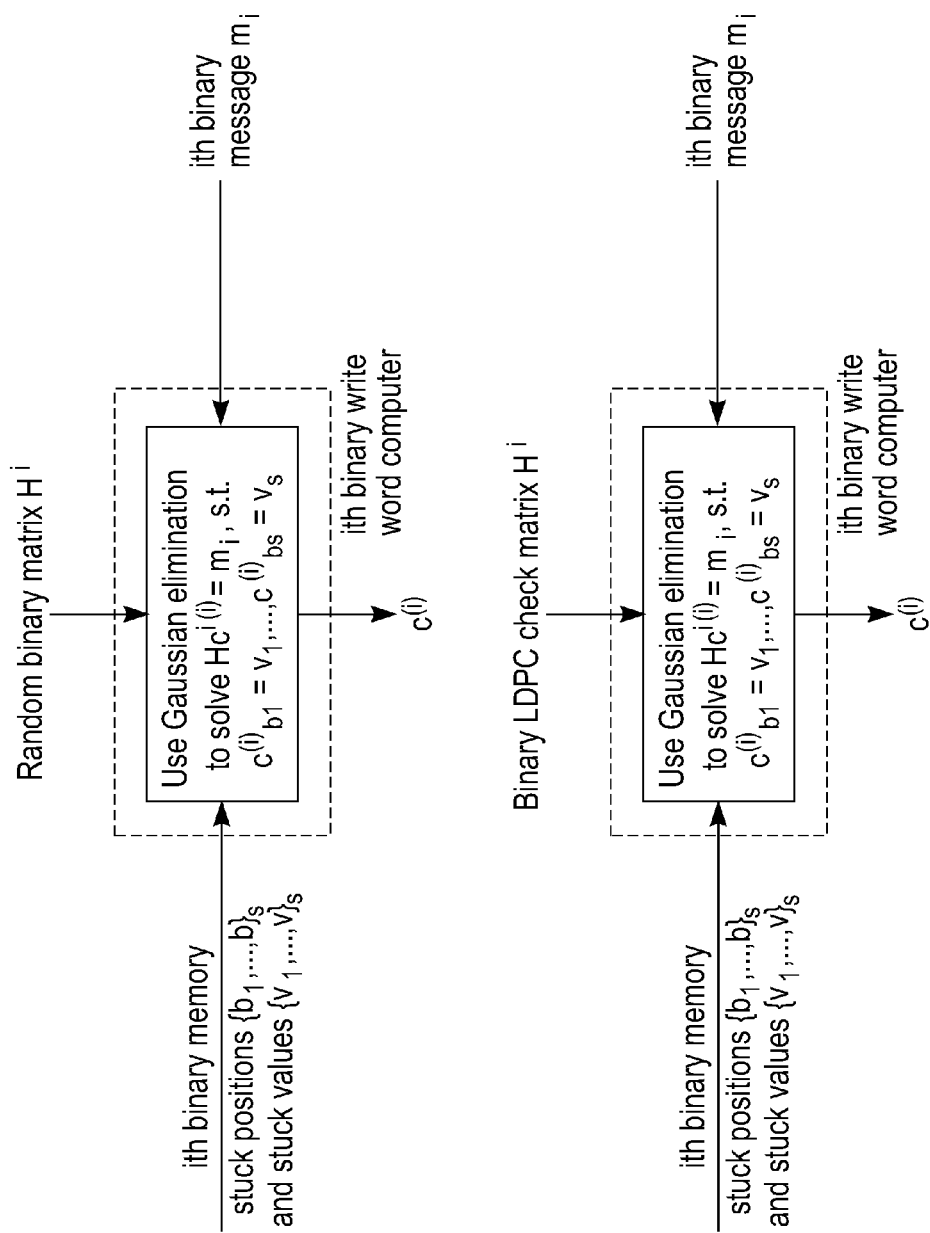
FIG. 16 illustrates block diagrams of binary write word computers using random binary and low density parity check (LDPC) codes and Gaussian elimination that may be implemented by an exemplary embodiment.

FIG. 16 illustrates block diagrams of binary write word computers using random binary and LDPC codes and Gaussian elimination that may be implemented by an exemplary embodiment. The terms "ith binary memory" refers to one of the virtual memories. The stuck positions in the ith virtual memory are represented as b with corresponding values v. The codebook that is utilized is referred to as H. The ith binary message "m" refers to the portion of the write data that will be written to the ith virtual memory.

Figure 17:
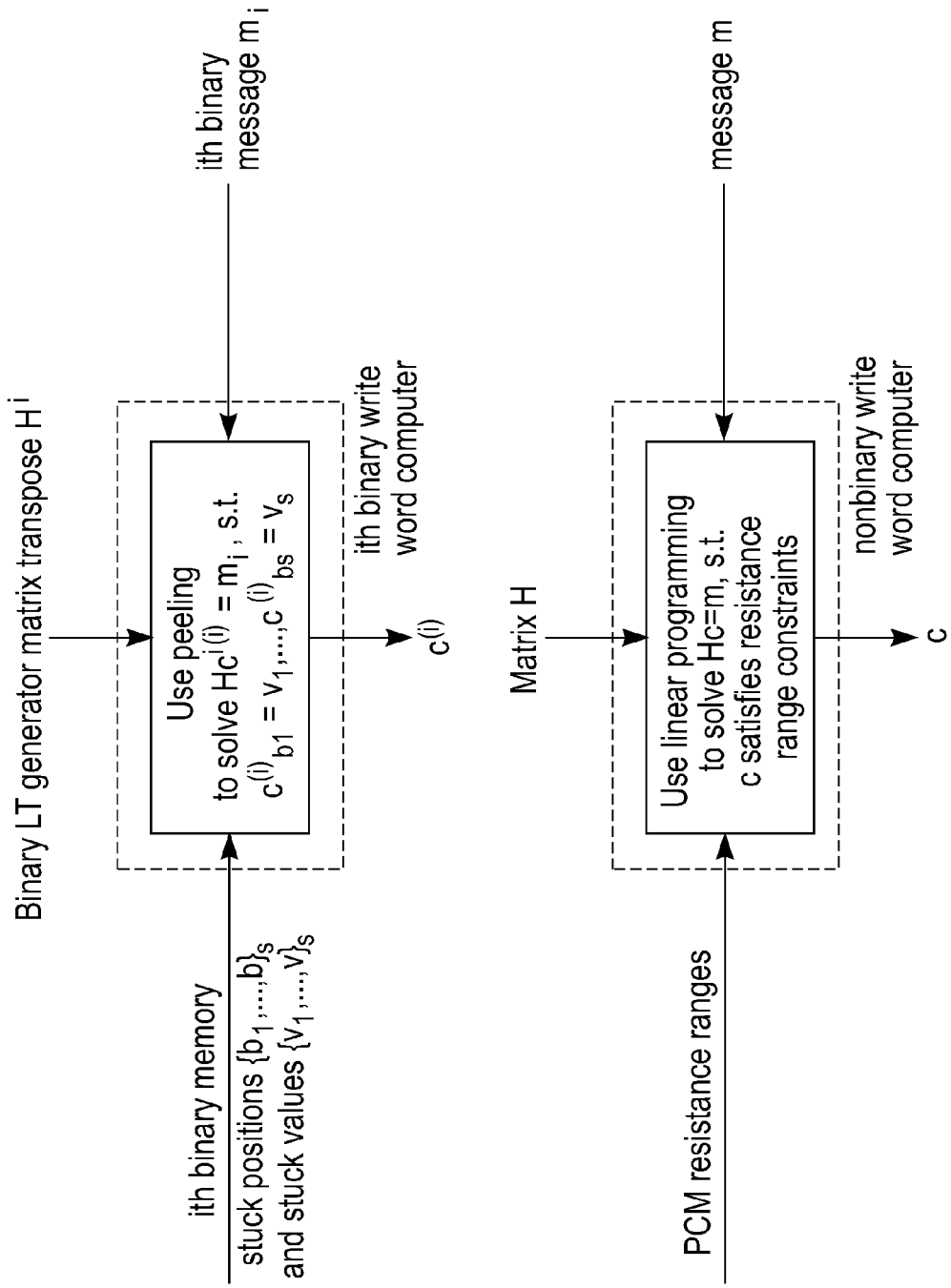
FIG. 17 illustrates block diagrams of a binary write word computer using Luby transform (LT) codes and peeling, and a non-binary write word computer using linear programming that may be implemented by an exemplary embodiment.

FIG. 17 illustrates block diagrams of a binary write word computer using Luby transform (LT) codes and peeling, and a non-binary write word computer using linear programming that may be implemented by an exemplary embodiment.

In an exemplary embodiment, the virtual write vector c, which satisfies the virtual memory constraints, is computed as follows. For each virtual memory, the write and read processes share a generator matrix G and a parity check matrix H such that $GH^T=0$. First a vector u is found such that Hu=m. Next a vector v is found such that the vector Gv+m satisfies the virtual memory constraints (where '+' denotes module-2 addition). Then c is computed as c=Gv+m. In the exemplary embodiment, the matrix G is constructed by selecting the weight of the columns from a probability distribution designed such that the vector v can be computed by using the peeling algorithm. In another exemplary embodiment, the matrix G is the generator or parity check matrix of an algebraic code.

Figure 18:
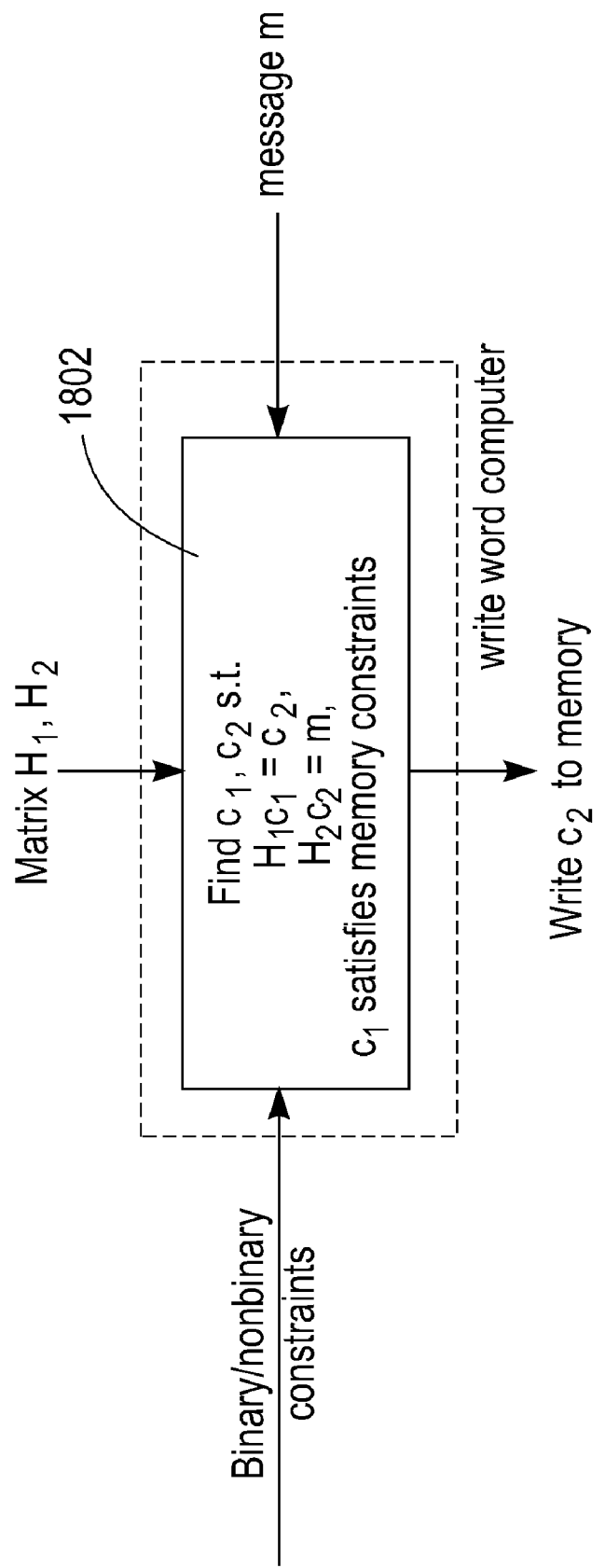
FIG. 18 illustrates a block diagram of a write word computer using concatenated coding that may be implemented by an exemplary embodiment.

In general, there will be a non-zero probability that the equation Hc=m is unsolvable for the selected code-matrix, the vector m, and the given constraints. FIG. 18 illustrates a block diagram of a write word computer using concatenated coding that may be implemented by an exemplary embodiment to reduce this probability. In this exemplary embodiment, for each virtual memory, two binary matrices H1 and H2 are shared between the write and read processes. For a given virtual memory the write process finds vectors c1 and c2 such that H1c1=c2 and H2c2 is equal to the message to be stored in memory. The word c1 is written into memory. The read process reconstructs the message by computing H2H1c1. Such concatenated coding may be used to achieve a reduction in the probability that an appropriate virtual write vector c cannot be found to satisfy the memory constraints and from which the message is recoverable.

In an alternate exemplary embodiment, to reduce this probability, the write and read processes share multiple H matrices, and a predetermined sequential order on these. If the first H matrix used by the write process cannot yield a vector c that is consistent with the memory heterogeneity, the write process retries with the second H matrix. This continues until a vector c is computed which is consistent with the memory heterogeneity. The index of the step at which the writing was successful becomes part of the metadata to be stored.

Figure 19:
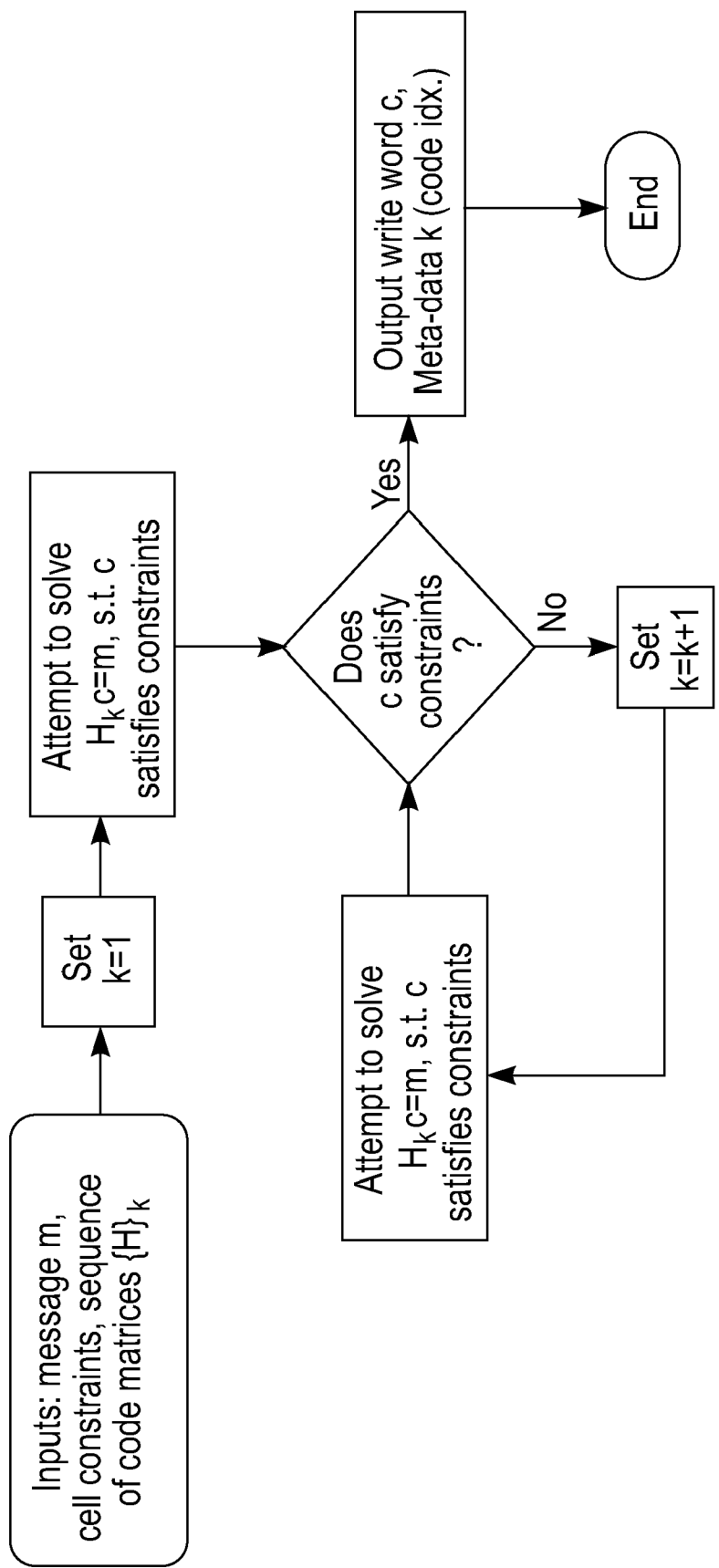
FIG. 19 illustrates a process where the write process encoder tries a pre-defined sequence of matrices to find a matrix which generates a codeword that encodes the message and satisfies the heterogeneous memory constraints that may be implemented by an exemplary embodiment.

FIG. 19 illustrates a process where the write process encoder tries a pre-defined sequence of matrices to find a matrix, which generates a codeword that encodes the message and satisfies the heterogeneous memory constraints that may be implemented by an exemplary embodiment. The matrix index used to create c is meta-data, which can be stored as described previously. The read process decoder has access to the same sequences of matrices, and uses the meta-data code index to determine which matrix to use for decoding.

Figure 20:
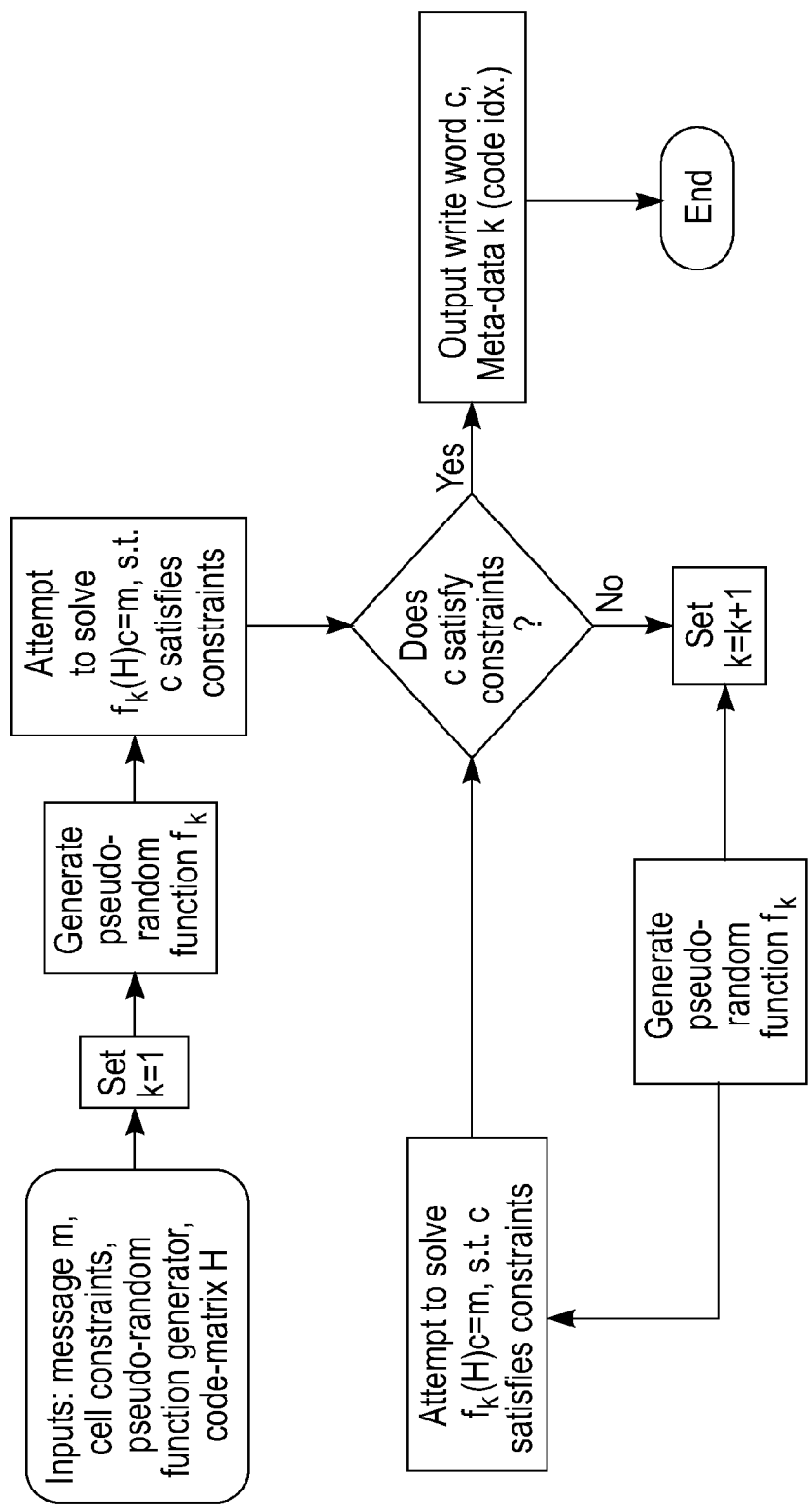
FIG. 20 illustrates a process where the write process encoder uses a pseudo-random function generator and code matrix in order to generate the predefined sequence of matrices depicted in FIG. 19 that may be implemented by an exemplary embodiment.

Using multiple code-matrices that may be large in terms of the number of entries may be cumbersome in terms of spatial or temporal complexity. This can be solved by generating the multiple matrices by applying a series of functions, which may be pseudo-random, on a single matrix. FIG. 20 illustrates a process where the write process encoder uses a pseudo-random function generator and code matrix in order to generate the predefined sequence of matrices depicted in FIG. 19 that may be implemented by an exemplary embodiment. The decoder shares the same pseudo-random generator. An example of the functions that may be used is functions that permute the columns of H. Thus, each function corresponds to a different, pseudo-random column permutation of the columns of H. In this embodiment, the write and read processes share an H matrix, and share a pseudo-random or predetermined sequential order of column permutations of the H matrix. The write process initially uses the matrix generated by the first column permutation on the H matrix. If this yields a vector c, which is inconsistent with the memory heterogeneity, the write process rewrites the data with the matrix generated by the second column permutation on the H matrix. This continues until a vector c is computed which is consistent with the memory heterogeneity. The index of the step at which the writing was successful becomes part of the metadata to be stored.

In an exemplary embodiment, each memory cell supports the same number of resistance levels(say n), but the range of resistance levels varies with cell. In this case, the write process encodes data value d ($0<=d<=n-1$) in cell i by computing a level l supported by the cell such that l mod n=d. This level is written into the cell. The read process reconstructs the data value as d=l mod n.

In an exemplary embodiment, the read process can additionally determine the state of the cells by performing a destructive read. This involves the steps of programming each of a block of cells to its SET and RESET levels, using an appropriate programming pulse, and measuring the SET and RESET resistance levels, after reading the data. This is followed by rewriting the data back into the cells. In one embodiment, the write process uses binary decomposition of the resistance levels to write data into the memory cells in a manner consistent with the cell heterogeneity. The read process uses its knowledge of the cell states to correctly interpret the written data.

Figure 21:
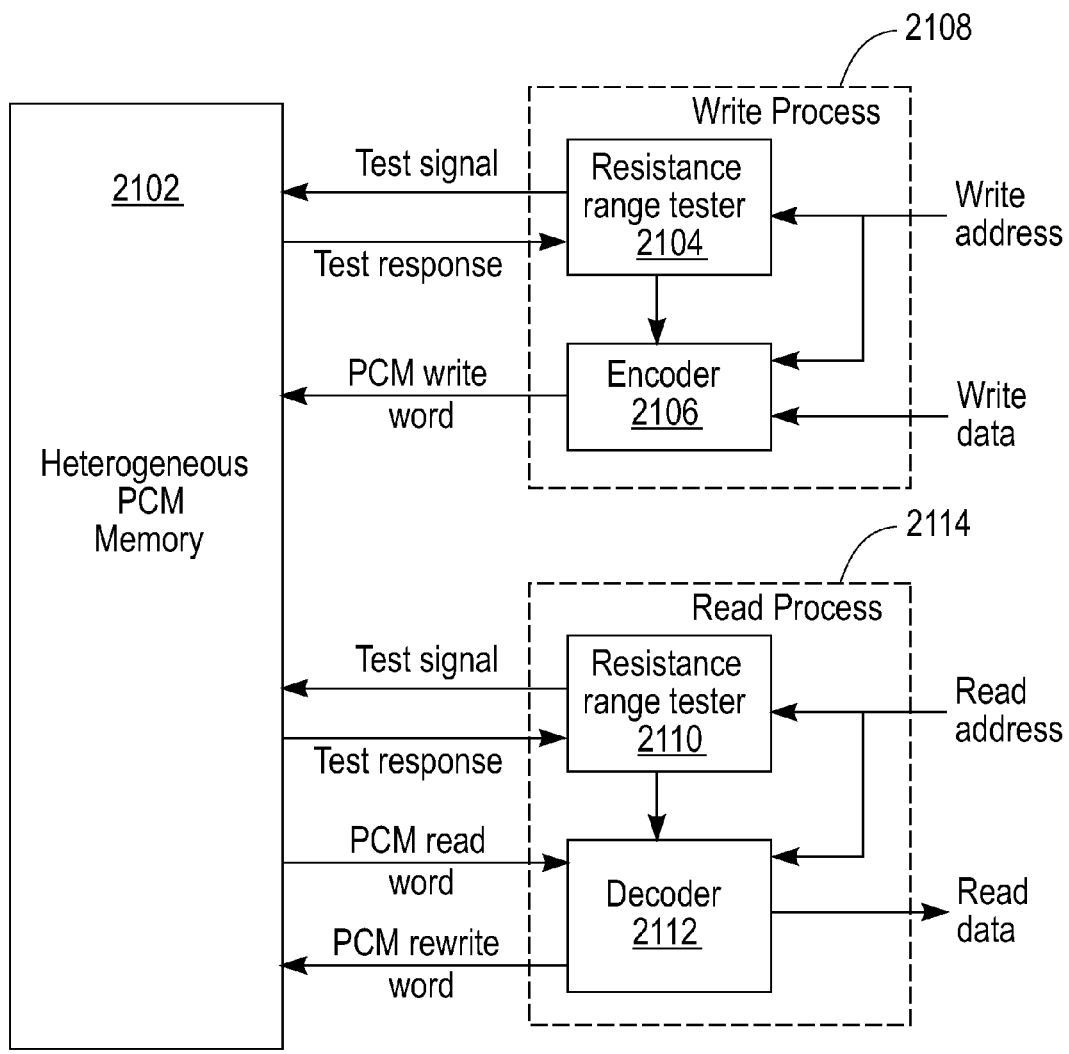
FIG. 21 illustrates a block diagram of a system for storing data in a PCM memory when both the read and write process can measure the resistance levels supported by each cell that may be implemented by an exemplary embodiment.

FIG. 21 illustrates a block diagram of a system for storing data in a PCM memory when both the read and write process can measure the resistance levels supported by each cell that may be implemented by an exemplary embodiment. The system depicted in FIG. 21 includes heterogeneous PCM memory 2102 including blocks of memory cells, a resistance range tester 2104 for determining resistance levels when writing to the memory 2102, an encoder 2106 for receiving write data and generating a PCM write word for storage in the memory 2102, a decoder 2112 for receiving a PCM read word from the PCM memory 2102 and generating read data, and a resistance range tester 2110 for determining resistance levels when reading. An exemplary write process 2108 to a PCM memory utilizes the resistance range tester 2104 and an encoder 2106. An exemplary read process 2114 to a PCM memory 2102 utilizes the decoder 2112 and the resistance range tester 2110. In an exemplary embodiment, the resistance range testers 2104 and 2110 are combined.

Figure 22:
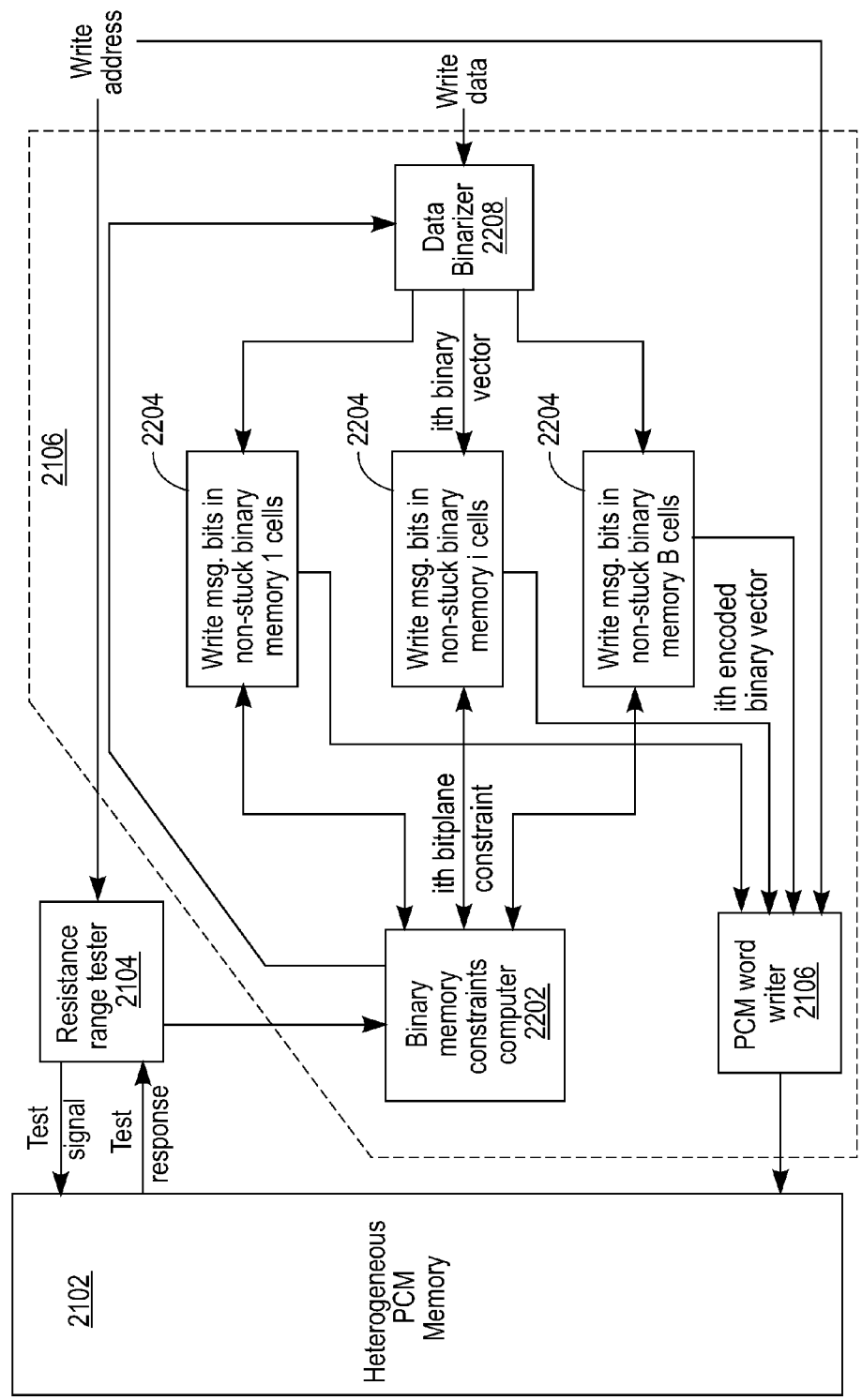
FIG. 22 illustrates a block diagram of a system for writing data to a PCM memory when both the read and write process can measure the resistance levels supported by each cell that may be implemented by an exemplary embodiment.

FIG. 22 illustrates a block diagram of an exemplary system for writing data to a PCM memory 2102 when both the read and write process can measure the resistance levels supported by each cell. FIG. 22 depicts a more detailed view of an encoder 2106 that may be implemented by an exemplary embodiment. The exemplary encoder 2106 includes a binary memory constraints computer 2202, write message bits block 2204, a data binarizer 2208, and a PCM word writer 2206. An exemplary process for writing that may be implemented by the system of FIG. 22 includes receiving write data and a write address corresponding to a block of heterogeneous memory cells. The physical characteristics of the memory cells are determined. The write data is separated into multiple partial write data vectors, each of which is associated with one virtual memory. This is done on the basis of the memory constraints identified for each virtual memory. The following steps are performed for each of the virtual memories: generating a constraint vector that describes the memory cells in the virtual memory (e.g., performed by the binary memory constraints computer 2202), the generating responsive to the physical characteristics of the memory cells, to any previously generated constraint vectors for the block of memory cells, and to any previously generated virtual write vectors for the block of memory cells; and calculating a virtual write vector in response to the constraint vector and the partial write data (e.g., performed by the write message bits block 2204). The virtual write vector is generated by simply writing the bits of the partial write data in order into the virtual memory, skipping each virtual memory cell that is stuck to a value. The virtual write vectors are combined by the PCM word writer 2206 into a write word that is output to the block of memory cells.

Figure 23:
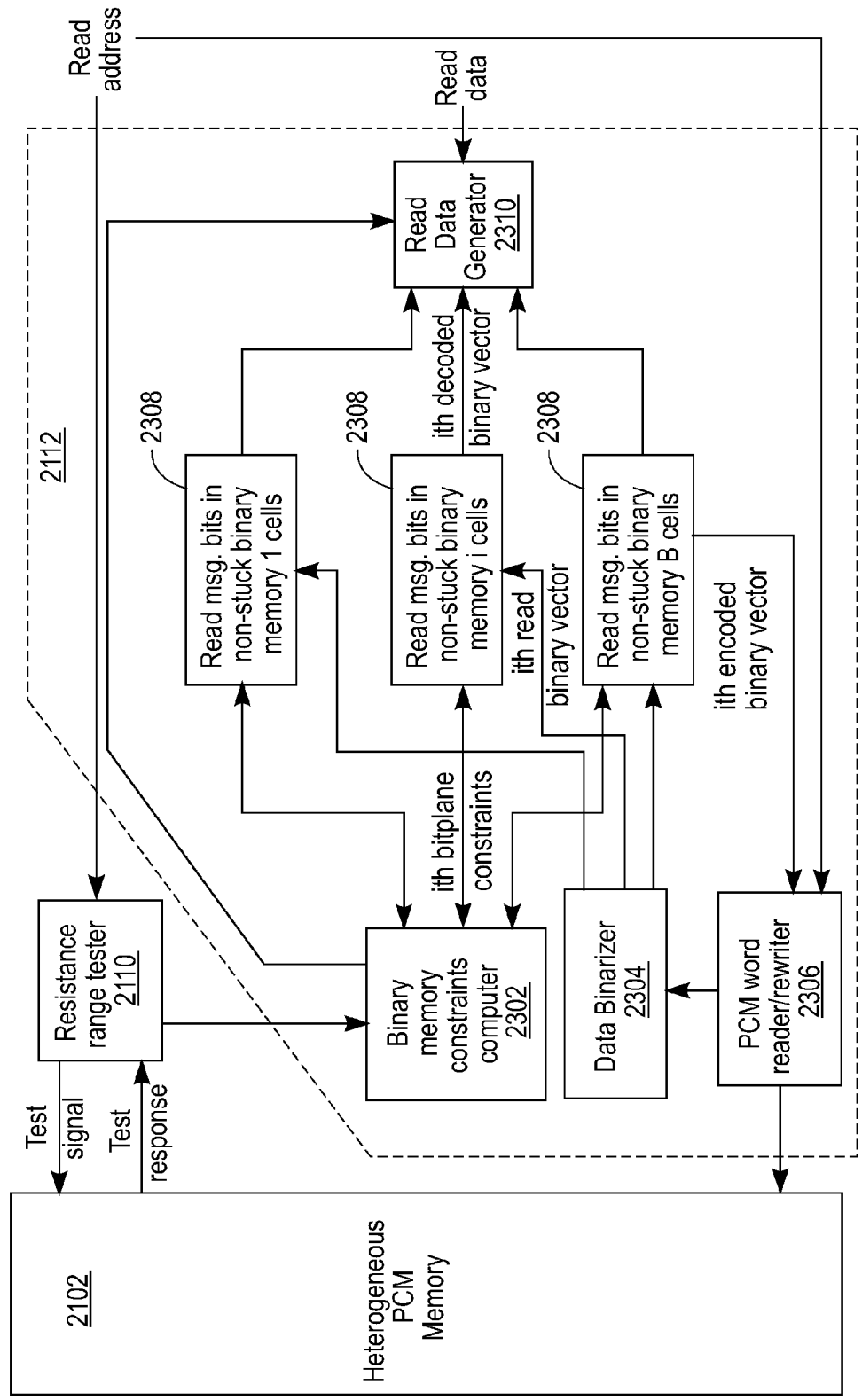
FIG. 23 illustrates a block diagram of a system for reading data from a PCM memory when both the read and write process can measure the resistance levels supported by each cell that may be implemented by an exemplary embodiment.

FIG. 23 illustrates a block diagram of a system for reading data from a PCM memory 2102 when both the read and write process can measure the resistance levels supported by each cell that may be implemented by an exemplary embodiment. FIG. 23 depicts a more detailed view of an exemplary decoder 2112 that may be implemented by an exemplary embodiment. The exemplary decoder 2202 includes a PCM word reader/rewriter 2306, a data binarizer 2304, a binary memory constraints computer 2302, read message bit blocks 2308, and a read data generator 2310. An exemplary process for reading that may be implemented by the system of FIG. 23 includes receiving a read word from a block of memory cells (e.g., performed by the PCM word reader/rewriter 2306) and determining physical characteristics of the memory cells (e.g., performed by the resistance range tester 2110). The read word is separated into a plurality of virtual read vectors based on the physical characteristics (e.g., performed by the binary memory constraints computer 2302). The following steps are performed for each of the virtual memories: generating a constraint vector that describes the memory cells in the virtual memory, the generating in response to the physical characteristics of the memory cells, to any previously generated constraint vectors for the block of memory cells, and to any previously generated virtual read vectors for the block of memory cells; and generating a partial read data vector in response to the constraint vector (e.g., performed by the read message bit blocks 2308). The partial read vector is generated by simply reading the bits in order from the virtual memory, and discarding the bit read from each virtual memory cell that is stuck to a value. The partial read data vectors are combined into read data by the read data generator 2310 and the read data is output.

In an exemplary embodiment, each cell has a subset of levels, which can be written but with increased cost in terms of writing time and power. In one exemplary embodiment, the write process performs the method described in FIG. 1 but uses the enhanced cost levels if the resultant vector c is inconsistent with the other levels. In another exemplary embodiment, the write process computes the optimal set of levels to write to for a given cost constraint, and then uses the method of FIG. 1 to write data to these levels. In both embodiments the read process uses the method of FIG. 2.

In an exemplary embodiment, the cell levels are noisy, in addition to being heterogeneous. As is known in the art, noise refers to changes to physical characteristics of the memory over time. The write process may employ a set of binary virtual memories perform binarization of the cell levels as described in FIG. 1. Subsequently, the write process uses nested codes in order to write to each virtual memory. In one exemplary embodiment, the write and read processes share matrices H1 and H, such that $H^T=[H1^T|H2^T]$. Here, $H^T$ represents the transpose of matrix H. The write process computes a vector c such that H2c is the message to be stored, c satisfies the heterogeneity of the memory, and H1$c$ is 0. Given a noisy vector c', the read process computes a vector c such that c is close to c' (in terms of Hamming distance, for example) and H1$c$=0. Then it reconstructs the message as H2$c$. The matrices H1 and H2 may be such that H is the generator or parity check matrix for an algebraic code such as a BCH or Reed-Solomon code.

Figure 24:
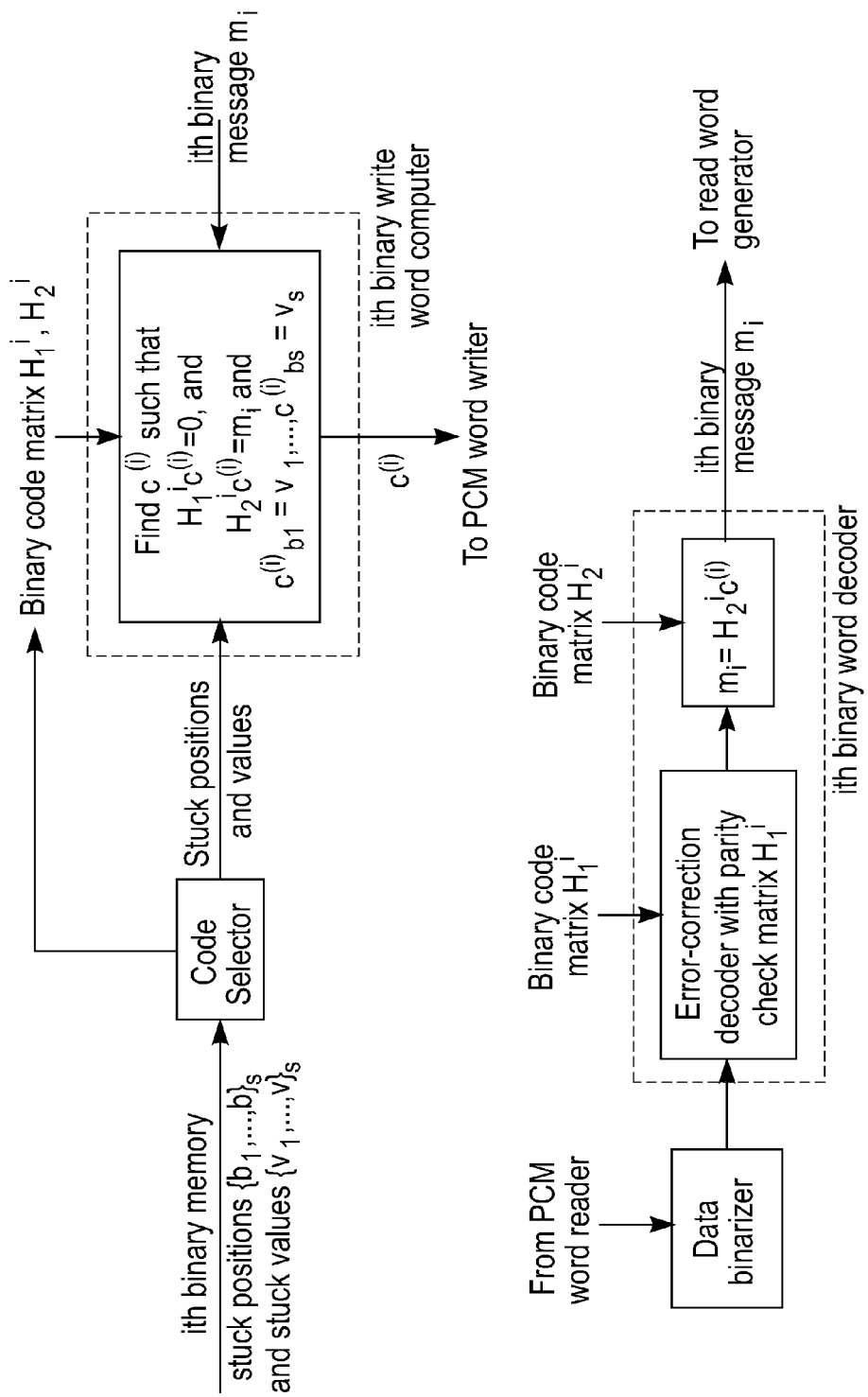
FIG. 24 illustrates a binary word computer and binary word decoder for storing data in noisy heterogeneous memory that may be implemented by an exemplary embodiment.

FIG. 24 illustrates a binary word computer and binary word decoder for storing data in noisy heterogeneous memory that may be implemented by an exemplary embodiment. The decoder depicted in FIG. 24 uses matrix $H_1$ to perform error correction and retrieve c. Then, the message, m, is computed as m=$H_2$c.

In an exemplary embodiment, the metadata generated to be stored in memory by the write process includes partial information about the matrix H. As an example, the write process has a choice of using one of multiple possible H matrices, and the partial information consists of data, which allows the read process to distinguish which of the H matrices was used by the write process. As another example, the partial information consists of data, which allows the receiver to reconstruct the H matrix used by the write process, wherein the H matrix is generated pseudo-randomly by both read and write processes.

Figure 25:
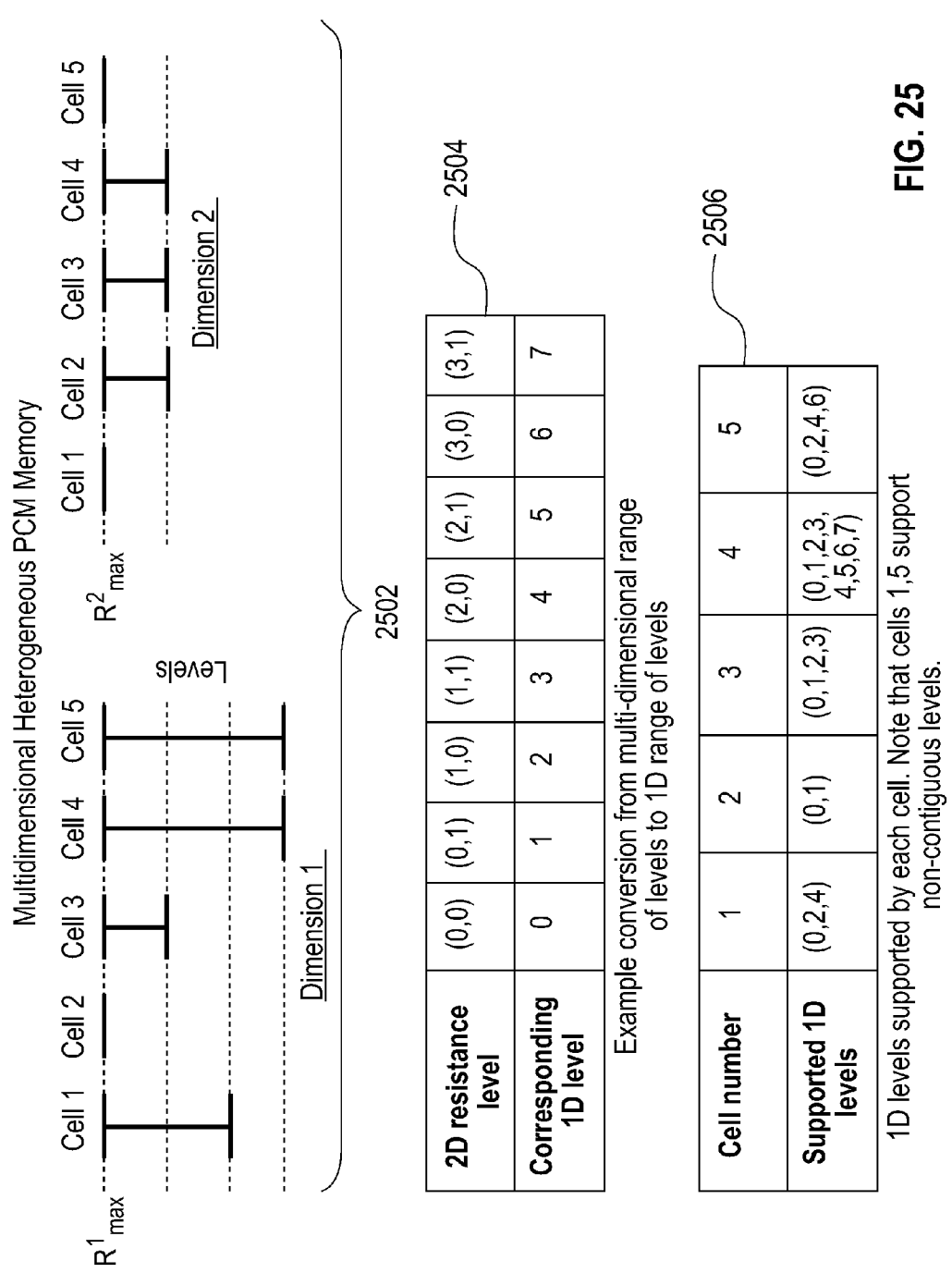
FIG. 25 illustrates a conversion of heterogeneous multidimensional memory constraints into equivalent one-dimensional constraints that may be implemented by an exemplary embodiment.
Figure 26:
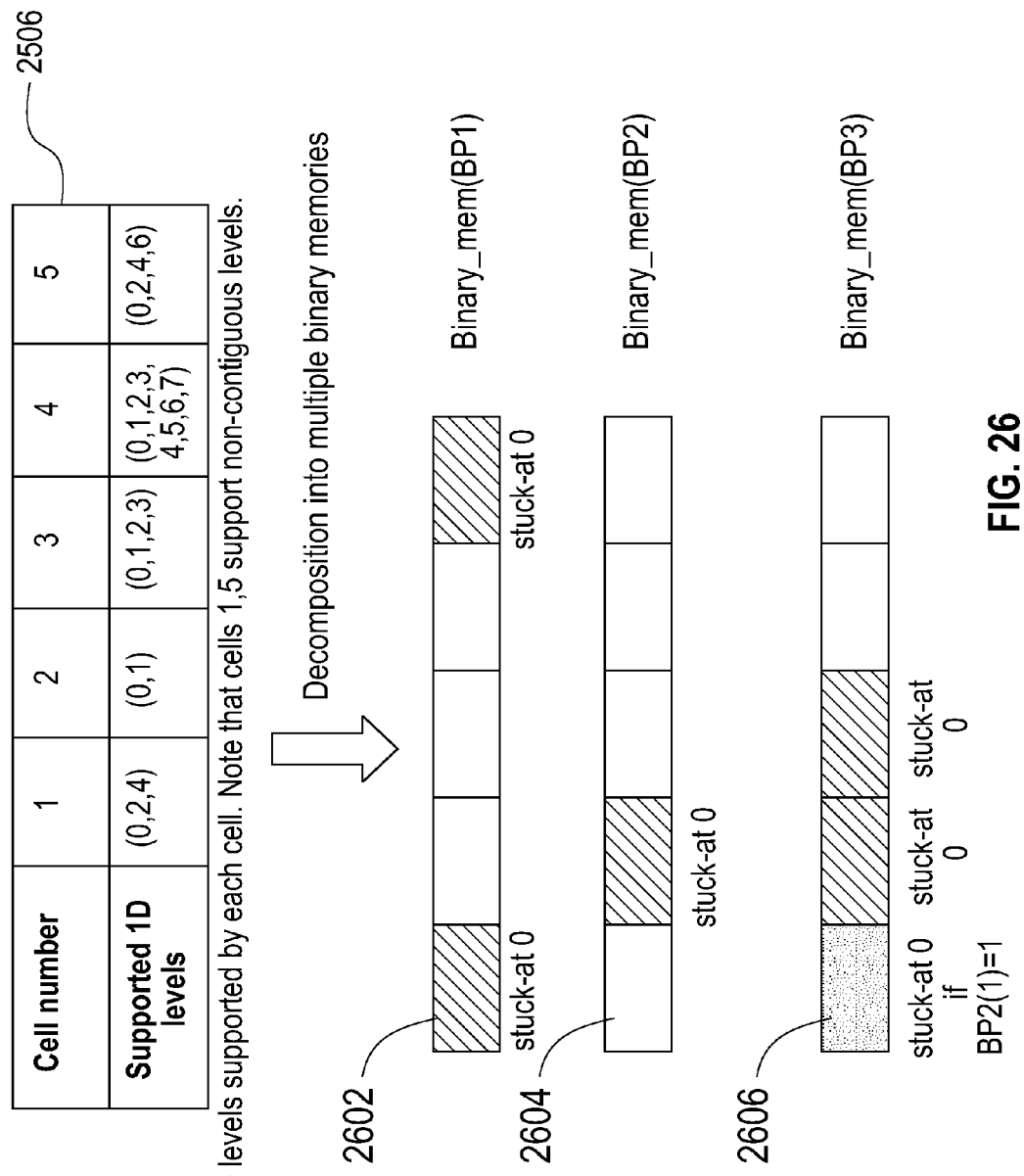
FIG. 26 illustrates a decomposition of equivalent one-dimensional constraints obtained from multidimensional memory constraints, into equivalent constraints on a set of virtual binary memories that may be implemented by an exemplary embodiment.

In an exemplary embodiment, the physical characteristic used to store information is multi-dimensional. In an exemplary embodiment, a plurality of voltage measurements are used to read information stored in a PCM memory element, and the cell resistance is different for different voltages. The combined cell response across the multiple voltage signals forms a multidimensional value, which is used to store information. The memory is heterogeneous in that the range of values supported by each cell in each dimension is different for different cells. FIG. 25 and FIG. 26. shows an exemplary embodiment of how heterogeneous multidimensional memory constraints can be decomposed into equivalent one-dimensional constraints on a set of virtual binary memories. In this example, in FIG. 25 there is shown a memory block with five cells 2502 wherein the resistance value characterizing each cell is two-dimensional. Cell 1 supports three levels in the first dimension and one level in the second dimension. Cell 2 supports one level in the first dimension and two levels in the second. Cell 3 supports two levels in the first dimension and two levels in the second. Cell 4 supports four levels in the first dimension and two levels in the second. Cell 5 supports four levels in the first dimension and one level in the second. The entire range of multidimensional values can be converted to an equivalent one-dimensional range by selecting any ordering of the two-dimensional values that covers all 2D values. An exemplary ordering is shown in table 2504. Each cell then supports a set of levels from the equivalent 1D range of levels. Table 2506 shows the levels supported by each cell for the heterogeneous memory block 2502, when the conversion to 1D values is as described in table 2504. It should be noted that the set of 1D levels supported by a set may be non-contiguous or contiguous. For example, cell 1 supports 1D levels 0, 2 and 4, which is a non-contiguous set of levels. In FIG. 26 is shown how this heterogeneous memory with multidimensional values can be decomposed into virtual binary memories with computed constraints on the virtual cells of these virtual memories. Since there are a total of 8 1D levels, three virtual binary memories are needed. Virtual cells 1 and 5 in binary memory one 2602 are constrained to be stuck at 0. Virtual cell 2 in binary memory two 2604 is constrained to be stuck at 0; other cells in binary memory two are unconstrained. In binary memory three 2606, virtual cells 1,2 and 3 have various constraints. Once these constraints have been computed, the techniques described previously are then used to store information efficiently in this memory.

In an exemplary embodiment, the information about the cells' physical characteristics is only partially available. This might be the case, for instance, if the physical characteristics of only a subset of all cells are available. In this case the techniques described above are used such that the data vector written into the memory satisfies constraints derived from the known partial cell information.

In an exemplary embodiment, the set of constraints imposed by the memory cell heterogeneity are manifested in the form of a restriction on the letters (binary or non-binary) which may be stored in a given cell or in a given bitplane of a given cell, and this restriction varies across different cells and across different bitplanes.

The techniques described above can also be used when the memory elements use a physical characteristic other than resistance in order to store information, and the said physical characteristic displays variability across different memory elements. These techniques can also be used to improve the yield of memory chips, since they allow efficient data storage in memories with some or all heterogeneous cells. In a naive system, any memory chip which has more than a certain proportion of cells which do not support a certain pre-specified range of memory levels may need to be discarded. This may drive down the yield. Instead, using the techniques described herein, cells that do not support the pre-specified range of memory levels may still be used to store information. Thus, fewer chips need to be discarded, thereby improving yield.

Technical effects and benefits include the ability to store information in any memory with elements characterized by any kind of heterogeneity which impacts the type and amount of data that can be stored per cell. This provides enhanced flexibility when compared to previous approaches that sought to store data in partially defective memory. Exemplary embodiments allow very efficient memory storage by increasing the amount of information that may be stored. Exemplary embodiments may also be utilized to increase memory yield by allowing efficient data storage on memories with cells that display non-perfect, variable physical characteristics, instead of discarding such chips.

The terminology used herein is for the purpose of describing particular embodiments only and is not intended to be limiting of the invention. As sued herein, the singular forms "a", "an" and "the" are intended to include the plural forms as well, unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to includes any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted, or modified. All of these variations are considered a part of the claimed invention.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for storing data, the method comprising:
   a write process writing to a memory,
   wherein the physical characteristics of memory cells in the memory support different sets of data levels, and
   the write process takes into account the different sets of data levels when writing to the memory, the write process comprising:
      receiving a write message to be written to a block of memory cells in the memory;
      determining physical characteristics of the memory cells in the block;
      identifying virtual memories associated with the block of memory cells in response to the physical characteristics;
      performing for each of the virtual memories:
         generating a constraint vector that describes virtual cells in the virtual memory, the generating in response to the physical characteristics of the memory cells, to previously generated constraint vectors, and to previously generated virtual write vectors; and
         calculating a virtual write vector in response to a codebook, the constraint vector and the write message;
      combining the virtual write vectors into a write word; and
      outputting the write word to the block of memory cells.

2. The method of claim 1, wherein the performing further includes selecting a codebook from a plurality of codebooks based on contents of the constraint vector and on the number of memory cells in the block of memory cells, and storing a codebook identifier to identify the codebook utilized to calculate the virtual write vector.

3. The method of claim 1, wherein the constraint vectors describe positions and supported levels for the virtual cells.

4. The method of claim 1, wherein the write message is separated into partial write vectors each of which corresponds to a virtual memory, a codebook is a linear code assigning syndromes to virtual write vectors, and the calculating includes computing a virtual write vector which is consistent with the constraint vector generated for the virtual memory, and that the syndrome of the virtual write vector is the partial write vector corresponding to the virtual memory.

5. The method of claim 1, wherein the calculating includes one or more of Gaussian elimination, peeling, and trellis based decoding, and a codebook is defined by one or more of a random binary matrix, a binary low density parity check (LDPC) check matrix, a binary Luby transform (LT) matrix, an algebraic code, and a convolutional code.

6. The method of claim 1, wherein the block of memory cells is phase change memory (PCM) and the physical characteristics include a resistance level range for each memory cell.

7. The method of claim 1, wherein the block of memory cells is PCM, the physical characteristics include a resistance level range for each memory cell, the constraint vectors describe positions and supported levels for the virtual memory cells, and the write word includes resistance levels to be written to each PCM memory cell.

8. The method of claim 1, wherein a codebook is represented by a matrix and linear programming is utilized to calculate the virtual write vector.

9. The method of claim 1, wherein a codebook is represented by a concatenated code.

10. The method of claim 1, wherein the block of memory cells is flash memory and the physical characteristics include a threshold voltage characteristic of each memory cell.

11. The method of claim 1, wherein the step of calculating can fail and wherein the virtual write vector is computed by applying one or more codebooks until a codebook is located such that the calculating does not fail.

12. The method of claim 1, wherein the memory cells are subject to noise and the calculating includes selecting the virtual write vector such that it additionally belongs to a second codebook.

13. The method of claim 1, wherein the physical characteristics include multi-dimensional levels, and where the write process further comprises converting the multidimensional levels into one-dimensional levels by using an ordering which covers all multidimensional levels.

14. The method of claim 1, wherein the unit is a block of memory cells.

15. The method of claim 1, further comprising a read process reading from the memory, the read process first obtaining data in the memory and subsequently determining how to interpret the data.

* * * * *